(12) United States Patent
Takahashi

(10) Patent No.: US 10,542,629 B2
(45) Date of Patent: Jan. 21, 2020

(54) ELECTRONIC APPARATUS COVER

(71) Applicant: SONY CORPORATION, Tokyo (JP)

(72) Inventor: Shunichi Takahashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/074,204

(22) PCT Filed: Mar. 9, 2017

(86) PCT No.: PCT/JP2017/009555
§ 371 (c)(1),
(2) Date: Jul. 31, 2018

(87) PCT Pub. No.: WO2017/169638
PCT Pub. Date: Oct. 5, 2017

(65) Prior Publication Data
US 2019/0150308 A1     May 16, 2019

(30) Foreign Application Priority Data
Mar. 31, 2016   (JP) .................. 2016-071928

(51) Int. Cl.
*H05K 5/03* (2006.01)
*G06F 1/16* (2006.01)
(Continued)

(52) U.S. Cl.
CPC ............... *H05K 5/03* (2013.01); *A45C 11/00* (2013.01); *G06F 1/16* (2013.01); *G06F 1/1613* (2013.01);
(Continued)

(58) Field of Classification Search
None
See application file for complete search history.

(56) References Cited

U.S. PATENT DOCUMENTS 7,277,081 B2 *  10/2007  Ukita ................. G06F 1/1616
                                                  345/156
9,244,555 B2 *   1/2016  Huang ................ G06F 1/1616
                        (Continued)

FOREIGN PATENT DOCUMENTS

EP      2882171 A1   6/2015
JP      3109489 U    5/2005
                (Continued)

OTHER PUBLICATIONS

International Search Report and Written Opinion of PCT Application No. PCT/JP2017/009555, dated Apr. 11, 2017, 08 pages of ISRWO

*Primary Examiner* — Xanthia C Cunningham
(74) *Attorney, Agent, or Firm* — Chip Law Group

(57) ABSTRACT

Convenience in operating an electronic apparatus is improved for the purpose of protection of the electronic apparatus in a state mounted to the electronic apparatus. Therefore, an electronic apparatus cover includes a cover portion that covers at least a part of a display surface of an electronic apparatus, the cover portion including an operation position specifying recess that makes it easy to specify an operation position and a base being a portion other than the operation position specifying recess, at least a part of a circumferential portion of the operation position specifying recess being an operated portion, the operated portion being thinner than the base, a contact operation for causing the electronic apparatus to execute a specific function being performed on the operated portion. When such an electronic apparatus cover is mounted to the electronic apparatus, convenience in operating the electronic apparatus can be improved while ensuring protection of the electronic apparatus.

15 Claims, 24 Drawing Sheets

(51) Int. Cl.
*A45C 11/00* (2006.01)
*H04M 1/11* (2006.01)
*H04M 1/18* (2006.01)

(52) U.S. Cl.
CPC .............. *H04M 1/11* (2013.01); *H04M 1/185* (2013.01); *G06F 2200/1634* (2013.01); *G06F 2203/04107* (2013.01)

(56) References Cited

U.S. PATENT DOCUMENTS

| | | | |
|---|---|---|---|
| 9,952,629 B2* | 4/2018 | Chae | G06F 1/1677 |
| 10,075,579 B2* | 9/2018 | Won | G06F 1/165 |
| 2010/0238119 A1* | 9/2010 | Dubrovsky | G06F 1/1626 |
| | | | 345/169 |
| 2014/0073377 A1* | 3/2014 | Chang | H04B 1/3888 |
| | | | 455/575.8 |
| 2014/0198070 A1* | 7/2014 | Won | G06F 3/017 |
| | | | 345/173 |
| 2014/0204511 A1* | 7/2014 | Oh | G06F 1/1632 |
| | | | 361/679.01 |
| 2015/0155903 A1* | 6/2015 | Jang | H04B 1/3888 |
| | | | 455/575.8 |
| 2015/0229754 A1* | 8/2015 | Won | G06F 1/165 |
| | | | 455/575.8 |
| 2015/0348459 A1 | 12/2015 | Kim et al. | |
| 2018/0176354 A1* | 6/2018 | Mu | G06F 1/1616 |

FOREIGN PATENT DOCUMENTS

| | | |
|---|---|---|
| JP | 3124578 U | 8/2006 |
| JP | 2014-191560 A | 10/2014 |
| WO | 2015/183029 A1 | 12/2015 |

\* cited by examiner

ELECTRONIC APPARATUS COVER

CROSS REFERENCE TO RELATED APPLICATIONS

This application is a U.S. National Phase of International Patent Application No. PCT/JP2017/009555 filed on Mar. 9, 2017, which claims priority benefit of Japanese Patent Application No. JP 2016-071928 filed in the Japan Patent Office on Mar. 31, 2016.

TECHNICAL FIELD

The present technology relates to a technical field regarding an electronic apparatus cover and particularly to an electronic apparatus cover used for an electronic apparatus having a display surface including an operation region.

CITATION LIST

Patent Literature

Patent Literature 1: Japanese Patent Application Laid-open No. 2014-191560

BACKGROUND ART

In portable electronic apparatuses such as a mobile phone and a portable music player, apparatuses capable of executing various functions by operating a display surface formed of liquid crystal or the like with fingers are prevalent.

Such electronic apparatuses can reduce (or exclude) an operation unit such as a button for performing an operation and enlarge (increase the area of) a display surface, and thus have an advantage that information to be displayed on the display surface is easily viewable.

Further, there is a desire to operate such an electronic apparatus while driving or the like. However, it is very dangerous to operate an electronic apparatus while driving with the eyes being fixed on the display surface. Furthermore, there is another desire to operate an electronic apparatus in a pocket or bag in a blind way while walking.

In order to meet those desires, Patent Literature 1 discloses an electronic apparatus (input apparatus) capable of performing an intended operation (input) even in a state where the electronic apparatus is placed out of a field of view.

In the electronic apparatus described in Patent Literature 1, the display surface includes an input unit, which is not the display surface but a slant surface and is provided on each of the up, down, right, and left sides of the outer circumferential side of the display surface.

DISCLOSURE OF INVENTION

Technical Problem

By the way, in order to prevent an electronic apparatus (particularly display surface) from being damaged or broken due to drop or the like, the electronic apparatus is frequently used with a protective cover mounted thereon.

However, since such a protective cover covers the display surface of the electronic apparatus in the mounted state, there is a possibility that operability of the display surface to an operation region reduces. Further, it is convenient if an operation with respect to the operation region can also be performed while driving or walking with the electronic apparatus being in a pocket or a bag in a state where the display surface is covered with the protective cover after the safety is ensured.

In this regard, it is an object of an electronic apparatus cover of the present technology to improve convenience in operating an electronic apparatus for the purpose of protection of the electronic apparatus in a state mounted to the electronic apparatus.

Solution to Problem

An electronic apparatus cover according to the present technology includes a cover portion that covers at least a part of a display surface of an electronic apparatus, the display surface including an operation region in at least a part thereof, the cover portion including an operation position specifying recess for specifying an operation position in the operation region, and a base being a portion other than the operation position specifying recess, at least a part of a circumferential portion of the operation position specifying recess being an operated portion, the operated portion being thinner than the base, a contact operation for causing the electronic apparatus to execute a specific function being performed on the operated portion.

For example, in a case where an operation position is searched for with help from the texture given to a fingertip, the position to be operated can be easily specified by the operation position specifying recess.

Further, since the thickness of the operated portion is thinner than the thickness of the base, the position of the operated portion for executing a specific function can be easily specified. In particular, when the operated portion is the circumferential portion of the operation position specifying recess, the position of the operated portion can be more easily specified.

The electronic apparatus cover described above may further include: a holding portion that holds the electronic apparatus; and a coupling portion that couples the holding portion and the cover portion to each other.

With this configuration, the cover portion is connected to the holding portion via the coupling portion.

The coupling portion of the electronic apparatus cover described above may be bendable.

When the coupling portion is bent, it is possible to switch between a state where the cover portion is closed with respect to the holding portion and a state where the cover portion is opened with respect thereto. In other words, in a state where the holding portion holds the electronic apparatus, it is possible to switch between a state where a specific function can be executed with the cover portion covering the display surface of the electronic apparatus and a state where a specific function cannot be executed with the cover portion not covering the display surface.

The electronic apparatus cover described above may further include a locking portion for maintaining a state where the cover portion covers the at least a part of the display surface.

With this configuration, the position of the cover portion is difficult to shift with respect to the display surface including the operation region.

The operated portion of the electronic apparatus cover described above may include an inclined surface that is displaced to a display surface side with increasing distance to an inner side of the operation position specifying recess, and the inclined surface may be adapted to be touched and operated as the operated surface.

With this configuration, the operation position can be easily specified when the operator performs a contact operation on the inclined surface.

In the electronic apparatus cover described above, the operated portion may include a first operated portion to be operated for executing a first function, and a second operated portion to be operated for executing a second function.

With this configuration, at least two different functions are executed when contact operations are performed on the respective operated portions.

In the electronic apparatus cover described above, the second operated portion may be provided at a position at which the first operated portion is rotated by substantially 90° with respect to a center of the operation position specifying recess.

With this configuration, the positions of the first operated portion and the second operated portion are easily specified on the basis of the texture.

In the electronic apparatus cover described above, an inner side portion of the circumferential portion of the operation position specifying recess may be a through-hole that allows direct contact with the operation region of the electronic apparatus.

With this configuration, the difference in thickness between the outer circumferential edge and the inner circumferential edge of the circumferential portion increases.

In the electronic apparatus cover described above, an inner side portion of the circumferential portion of the operation position specifying recess may be provided as a flat surface portion that is thinner than the circumferential portion.

In other words, this provides a configuration to avoid direct contact with the display surface when a contact operation is performed on the operated portion.

In the electronic apparatus cover described above, the base may include at least three reference position specifying portions that are specified as reference positions with respect to the base, and a relative position of the cover portion to the display surface may be determined by specifying the reference positions.

When the display surface of the electronic apparatus detects a contact of the reference position specifying portion, the mounting of the electronic apparatus cover to the electronic apparatus is grasped.

Further, a relative position of the cover portion with respect to the display surface is grasped. In other words, a relative position of the circumferential portion, as the operated portion, with respect to the display surface is also grasped.

In the electronic apparatus cover described above, the reference position specifying portion may be formed of a material that changes a capacitance of the display surface.

With this configuration, when a touch panel type liquid crystal is particularly used as the display surface of the electronic apparatus, a relative position of the cover portion with respect to the display surface is easily grasped.

In the electronic apparatus cover described above, the operated portions may be portions of the circumferential portion that are on opposite sides and sandwich a center portion of the operation position specifying recess therebetween.

With this configuration, the operator can differently use a plurality of functions by operations in the same operation direction.

In the electronic apparatus cover described above, the operated portion may be the circumferential portion as a whole.

With this configuration, a plurality of functions can be assigned to a single operation position specifying recess.

In the electronic apparatus cover described above, the specific function may be executed by the contact operation whose operation direction is an inclination direction of the operated surface.

For example, a specific function is executed by a swipe operation climbing over a slant surface, or the like.

In the electronic apparatus cover described above, a function of switching an image displayed on the display surface depending on an operation direction of the contact operation may be executed as the specific function.

With this configuration, the operation direction of the contact operation in the operation position specifying recess and the direction in which the image is fed can be caused to coincide with each other.

Advantageous Effects of Invention

According to the present technology, it is possible to improve convenience in operating an electronic apparatus for the purpose of protection of the electronic apparatus in a state mounted to the electronic apparatus.

It should be noted that the effects described herein are merely examples and are not limited, and any other effects described herein may be provided.

MODE(S) FOR CARRYING OUT THE INVENTION

Hereinafter, embodiments will be described with reference to the attached drawings in the following order.

<1. Configurations of Electronic Apparatus Cover and Electronic Apparatus>
<2. Opening/closing Operation of Electronic Apparatus Cover>
<3. Operation Examples of Application>
[3-1. First Example]
[3-2. Second Example]
[3-3. Third Example]
<4. Position Correction>
[4-1. Configuration of Electronic Apparatus Cover]
[4-2. Processing of Electronic Apparatus]
<5. Modified Examples>
[5-1. Modified Example of Circumferential Portion]
[5-2. Modified Example of Outer Circumferential Edge and Inner Circumferential Edge]
[5-3. Other Modified Examples]
<6. Conclusion>
<7. Present Technology>

It should be noted that in the following description a smartphone is exemplified as an electronic apparatus referred to in the Claim.

1. CONFIGURATIONS OF ELECTRONIC APPARATUS COVER AND ELECTRONIC APPARATUS

Figure 1:
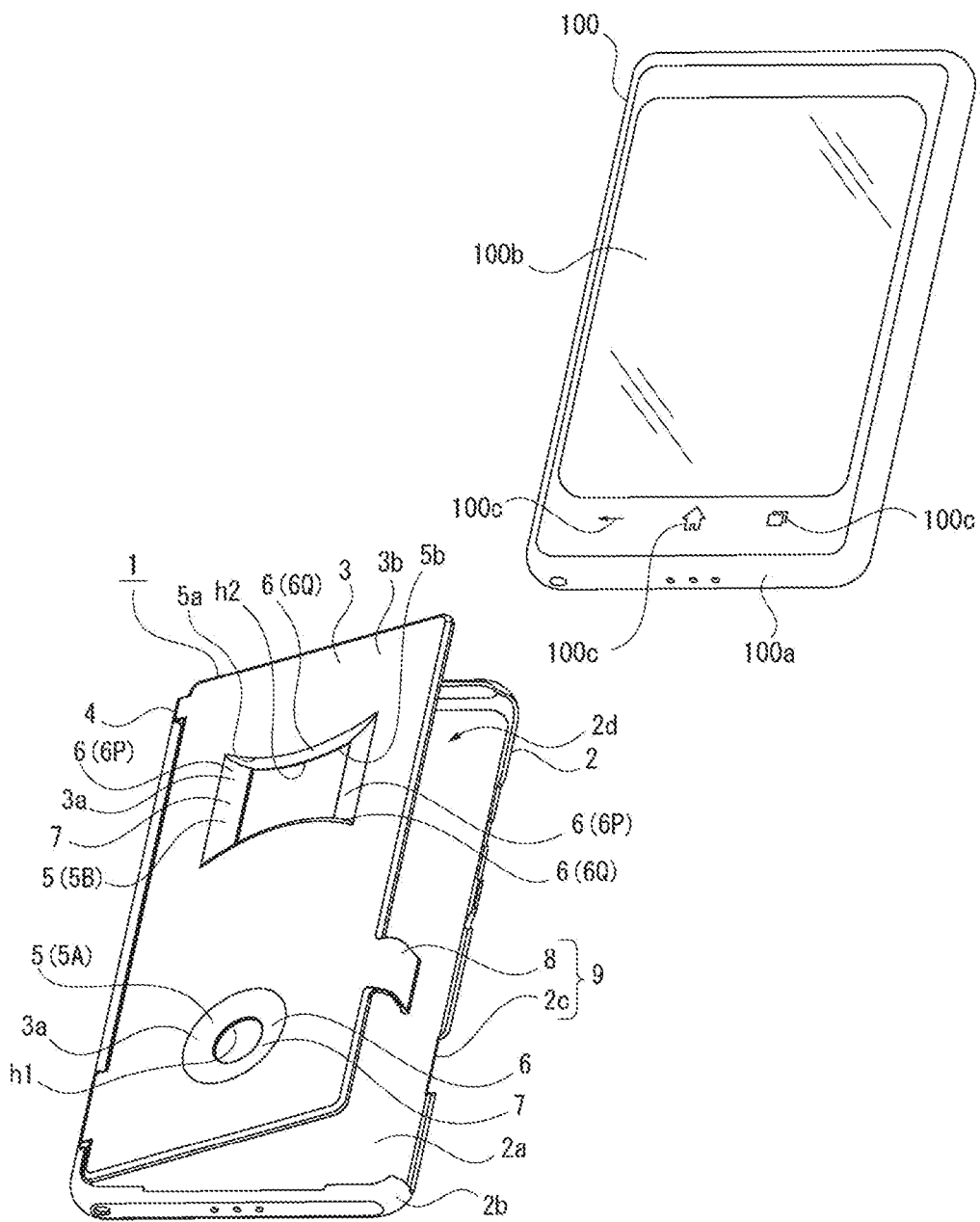
FIG. 1 is a perspective view of an electronic apparatus cover and an electronic apparatus of an embodiment of the present technology.

FIG. 1 shows configurations of an electronic apparatus cover 1 and an electronic apparatus 100 as a smartphone according to this embodiment.

The electronic apparatus 100 includes a main body portion 100a having a substantially cubic shape and an internal space in which electronic components such as an arithmetic processing device and a memory are appropriately disposed. A display surface 100b that is used as a touch panel and on which various types of information are to be displayed, and operation elements 100c, 100c, 100c for performing various operations, which are disposed in the vicinity of the display surface 100b, are provided on one surface of the main body portion 100a. In addition thereto, a charging terminal, a sound output terminal, a power source button, and the like are appropriately provided to the electronic apparatus 100.

At least one region of the display surface 100b is assumed as an operation region where an operator can perform various operations (flick operation, swipe operation, tap operation, etc.) by a touch with a fingertip or the like. In the description below, such an operation is referred to as a "contact operation".

The contact operation includes not only an operation performed by directly touching the display surface 100b but also an indirect operation performed with something intervening between a fingertip and the display surface 100b.

Specifically, a flick operation or the like performed via the electronic apparatus cover 1 mounted to the electronic apparatus 100 so as to cover the display surface 100b, which will be described later, is also considered as a contact operation.

A surface of the electronic apparatus 100 on which the display surface 100b is provided is formed into a substantially rectangular shape as shown in FIG. 1. In the following description, the longitudinal direction of the rectangular surface is referred to as "up and down direction", and the lateral direction thereof is referred to as "right and left direction". Additionally, in a case where one of those directions is described, "rightward", "leftward", "upward", or "downward" is described. Further, a direction in which the display surface 100b faces is referred to as "forward", and a direction opposite to the forward direction (i.e., a direction of the line of sight of an operator viewing the display surface 100b) is referred to as "rearward".

The electronic apparatus cover 1 includes a holding portion 2 that holds the electronic apparatus 100, a substantially flat-plate like cover portion 3 capable of covering the display surface 100b of the electronic apparatus 100, and a coupling portion 4 that couples the holding portion 2 and the cover portion 3 to each other.

The holding portion 2 includes a bottom portion 2a formed into a substantially flat plate, and a frame portion 2b protruding forward from the outer circumferential portion of the bottom portion 2a. A cutout portion 2c is formed in a part of the frame portion 2b.

A space formed by the bottom portion 2a and the frame portion 2b is a housing space 2d into which the main body portion 100a of the electronic apparatus 100 is fitted. When the main body portion 100a of the electronic apparatus 100 is housed in the housing space 2d, the electronic apparatus 100 is held by the holding portion 2.

The coupling portion 4 includes a mechanism capable of opening/closing the cover portion 3 with respect to the holding portion 2. Examples of the mechanism include a hinge mechanism. In other words, the coupling portion 4 is bendable.

Figure 2:
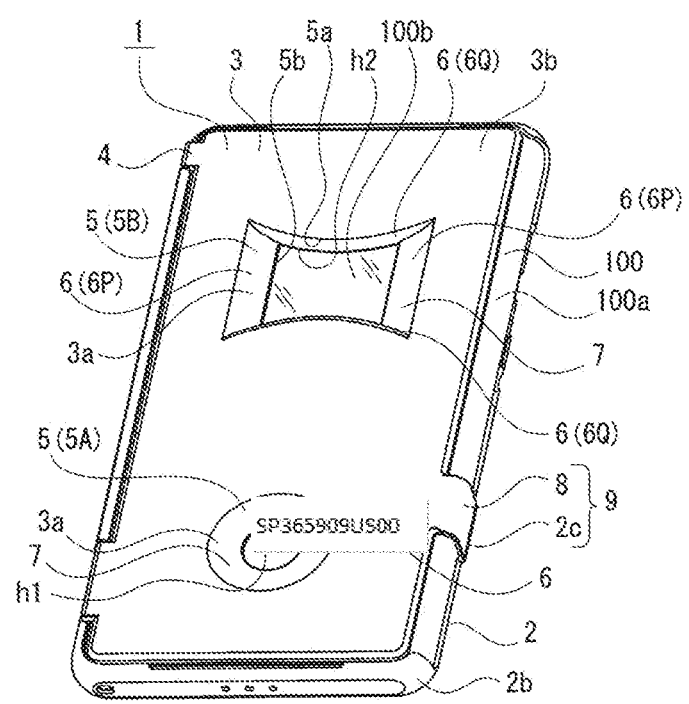
FIG. 2 is a perspective view showing a state where the electronic apparatus cover is mounted to the electronic apparatus.

When the cover portion 3 is closed with respect to the holding portion 2 according to the motion of the coupling portion 4, the display surface 100b of the electronic apparatus 100 held by the holding portion 2 is covered by the cover portion 3 (see FIG. 2).

Conversely, when the state where the cover portion 3 is covered by the display surface 100b is released according to the motion of the coupling portion 4, the display surface 100b is exposed, and the display unit 100b is open, so that a direct contact operation to the display surface 100b can be performed.

In the following description, the state where the cover portion 3 is closed with respect to the holding portion 2 (state shown in FIG. 2) is referred to as a "close state", and the state other than the former state (state where the display surface 100b is not covered by the cover portion 3) is referred to as an "open state".

As shown in FIG. 1, the cover portion 3 includes an operation position specifying recess 3a formed as a recess for specifying an operation position, and a base 3b corresponding to the other portion. The operation position specifying recess 3a is, for example, a recess provided such that an operator can recognize a specific position in a case where an operation element such as an icon for executing a specific function is displayed at the specific position of the display region of the display surface 100b in a state where the operator cannot look at the electronic apparatus 100. In other words, in the close state, the operator can grasp a specific position (the position of the operation element) by a sense of touch.

FIG. 1 shows an example in which the electronic apparatus cover 1 includes two operation position specifying recesses 3a, 3a. It should be noted that the number of operation position specifying recesses 3a provided to the electronic apparatus cover 1 may be one or may be three or more.

The operation position specifying recess 3a is formed into, for example, a substantially rectangular shape or annular shape. A frame-like circumferential portion 5 is provided to the operation position specifying recess 3a. The circumferential portion 5 is made thinner than the base 3b and includes an operated portion 6 for a user to execute a specific function.

Some examples are conceivable for the operated portion 6 provided to the circumferential portion 5.

For example, a single operated portion 6 may be provided so as to execute a single function.

Further, a plurality of operated portions 6, 6, . . . may be provided so as to execute a single function.

Furthermore, a plurality of operated portions 6, 6, . . . may be provided so as to execute two or more different functions.

In the electronic apparatus cover 1 shown in FIG. 1, the four operated portions 6, 6, 6, 6 for executing two functions are provided to the operation position specifying recess 3a disposed on the upward side of the base 3b. Those four operated portions 6, 6, 6, 6 form the circumferential portion 5. A single operated portion 6 for executing a single function is provided to the operation position specifying recess 3a disposed on the downward side of the base 3b. This single operated portion 6 forms the circumferential portion 5.

In the following description, the circumferential portion 5 including only the operated portion 6 for executing a single function is referred to as a circumferential portion 5A. The circumferential portion 5A may include a plurality of operated portions 6, 6, . . . for executing a single function.

The circumferential portion 5 including the plurality of operated portions 6, 6, . . . for executing two different functions is referred to as a circumferential portion 5B.

In the electronic apparatus cover 1 shown in FIG. 1, the circumferential portion 5 of the operation position specifying recess 3a disposed on the upward side of the base 3b is referred to as a circumferential portion 5B, and the circumferential portion 5 of the operation position specifying recess 3a disposed on the downward side of the base 3b is referred to as a circumferential portion 5A.

The four operated portions 6, 6, 6, 6 provided to the circumferential portion 5B are first operated portions 6P, 6P for executing a first function and second operated portions 6Q, 6Q for executing a second function. The first operated portions 6P, 6P are portions that are on the opposite sides and sandwich the center portion of the operation position specifying recess 3a therebetween. The second operated portions 6Q, 6Q are portions that are on the opposite sides and sandwich the center portion of the operation position specifying recess 3a therebetween.

The second operated portion 6Q is provided at a position at which the first operated portion 6P is rotated by substantially 90° with respect to the center of the operation position specifying recess 3a.

The circumferential portion 5 includes an inclined portion having a reduced thickness toward an inner circumferential edge 5b from an outer circumferential edge 5a. The forward surface of the inclined portion is a surface inclined to be displaced rearward with increasing distance to the inner side. This inclined surface is referred to as an operated surface 7.

When the operator touches the display surface 100b with a fingertip, the electronic apparatus 100 detects a change in capacitance in an electrode array disposed in a matrix on the inside or rearward side (depth direction) of the display surface 100b, in order to specify a touch position of the fingertip (operation position) or a direction of the fingertip moved while remaining in contact therewith (operation direction).

The electronic apparatus 100 detects the operation position or the operation direction of the operator and then executes a function corresponding to the operation position or the operation direction. For example, the electronic apparatus 100 executes a function of moving the page displayed on the display surface 100b forward to the next page according to a swipe operation.

In a case where a sheet thinned to a certain extent or the like is placed on the display surface 100b, the electronic apparatus 100 can detect a change in capacitance in the display surface 100b even when a contact operation is performed on the sheet. However, if the sheet has a larger thickness than a certain thickness, the electronic apparatus 100 fails to detect a change in capacitance in the display surface 100b. Further, even with the same thickness, whether a change in capacitance can be detected or not differs depending on the material of the sheet.

The thickness of the base 3b is set to such a thickness (or material) that the electronic apparatus 100 fails to detect a change in capacitance even when the operator performs a contact operation.

It should be noted that the material of the cover portion 3 needs to have electrical insulation properties. Additionally, it is favorable that the material has a certain degree of rigidity.

Specifically, the material is resin (molded resin or resin cut from a sheet-like base material), hard urethane, hard rubber, glass, ceramics, wood, natural leather, artificial leather (urethane etc.), woven fabrics, and the like.

Further, the circumferential portion 5 has such a thickness that a change in capacitance cannot be detected even when the operator performs a contact operation on each point of the outer circumferential edge 5a, whereas at least a part of the operated portion 6 has such a thickness that a change in capacitance corresponding to a contact operation of the operator can be detected.

Therefore, for example, in a case where the operator performs a contact operation by sliding a finger from the outer circumferential edge 5a toward the inner circumferential edge 5b, and when the finger reaches a spot at which a distance from the display surface 100b has a threshold or less in the operated surface 7 serving as a slant surface, the electronic apparatus 100 detects a change in capacitance.

Figure 3:
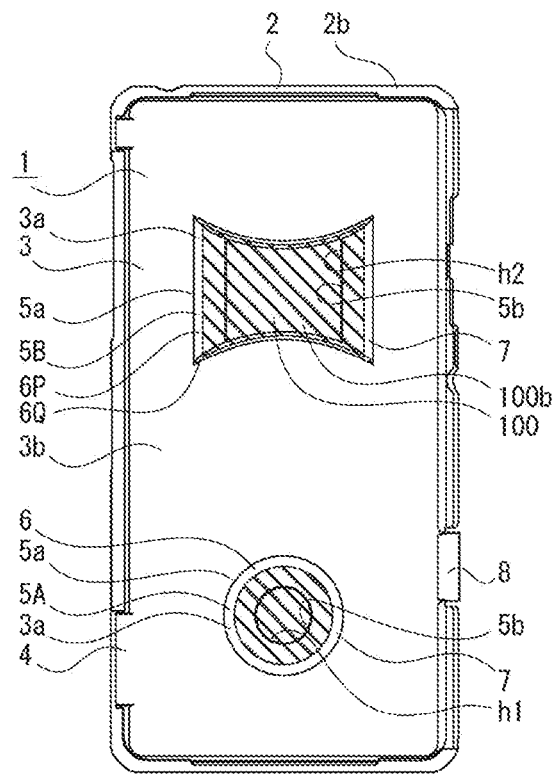
FIG. 3 is a front view showing a state where the electronic apparatus cover is mounted to the electronic apparatus.

FIG. 3 shows an example of a region where a contact operation of the operator can be detected in the close state.

In the hatched regions of FIG. 3, the electronic apparatus 100 can detect a contact operation of the operator. In a portion covered by the base 3*b* in the display surface 100*b*, the electronic apparatus 100 is unable to detect a contact operation. With this configuration, the functions are never executed unintentionally when the base 3*b* is touched in the close state of the electronic apparatus cover 1.

Figure 4:
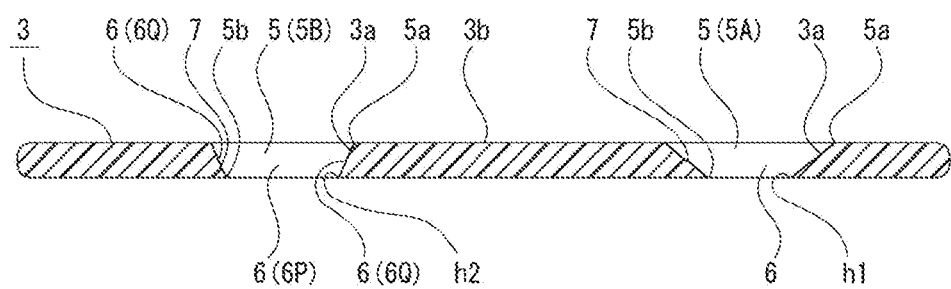
FIG. 4 is a cross-sectional view of a cover portion.

In the examples shown in FIGS. 1 to 3, the circumferential portion 5A of the operation position specifying recess 3*a* is circular, and the inner side of the circumferential portion 5A is a through-hole h1 (see FIG. 4).

Further, the circumferential portion 5B of the other operation position specifying recess 3*a* is substantially rectangular, and includes one pair of straight lines facing each other and the other pair of arc-like curved lines facing each other and projecting in a direction in which the curved lines approach each other. The inner side of the circumferential portion 5B is a through-hole h2 (see FIG. 4).

A protruding engaging projection portion 8 is provided substantially rearward from one end of the cover portion 3 of the electronic apparatus cover 1. When the engaging projection portion 8 and the cutout portion 2*c* of the holding portion 2 are engaged with each other in the close state, the electronic apparatus cover 1 enters a locked state where the close state is maintained. Further, when the engagement is cancelled, the electronic apparatus cover 1 is changed from the close state to the open state.

The engaging projection portion 8 and the cutout portion 2*c* form a locking portion 9 for maintaining the close state.

2. OPENING/CLOSING OPERATION OF ELECTRONIC APPARATUS COVER

Figure 5:
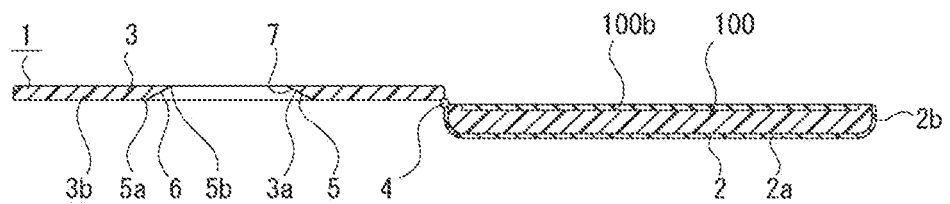
FIG. 5 is a cross-sectional view showing an open state.

FIG. 5 shows a cross-sectional view in the open state.

In the open state, the operator can perform a contact operation on the display surface 100*b* of the electronic apparatus 100, an operation on the operation element 100*c*, and the like. The electronic apparatus 100 executes predetermined feasible functions with respect to those operations.

In the state shown in FIG. 5, when the cover portion 3 is rotated with respect to the holding portion 2 with the coupling portion 4 as a fulcrum, the close state can be obtained.

Figure 6:
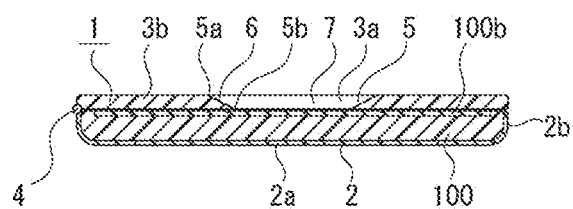
FIG. 6 is a cross-sectional view showing a close state.

FIG. 6 shows a cross-sectional view in the close state.

In the close state, as described above, the electronic apparatus 100 fails to detect a change in capacitance in the contact operation with respect to the base 3*b* of the electronic apparatus cover 1 and can detect only a contact operation with respect to a part of the operated portion 6.

The electronic apparatus 100 is configured to be capable of detecting the close state of the electronic apparatus cover 1.

The electronic apparatus 100 executes processing of activating software for executing a predetermined function in a case where the close state is detected.

In the following description, an operation of changing to the close state or an operation of changing to the open state is referred to as an "operation of opening/closing the cover portion 3".

3. OPERATION EXAMPLES OF APPLICATION

An application (software) is installed in advance in the electronic apparatus 100.

The application executes a predetermined function according to a contact operation of the operator or the like.

First, detection of a contact operation of the operator and execution of a specific function will be described before each example is described.

Figure 7A:
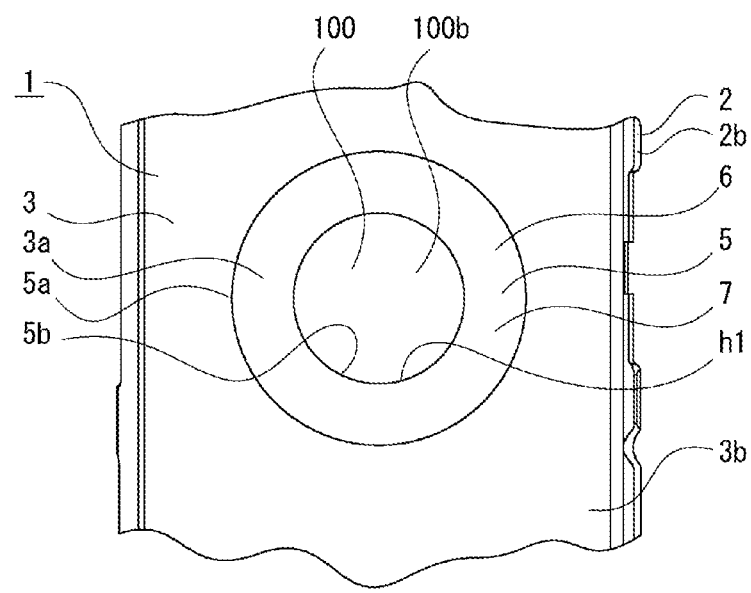
FIGS. 7A and 7B are diagrams for describing a contact operation with respect to an operation position specifying recess.
Figure 7B:
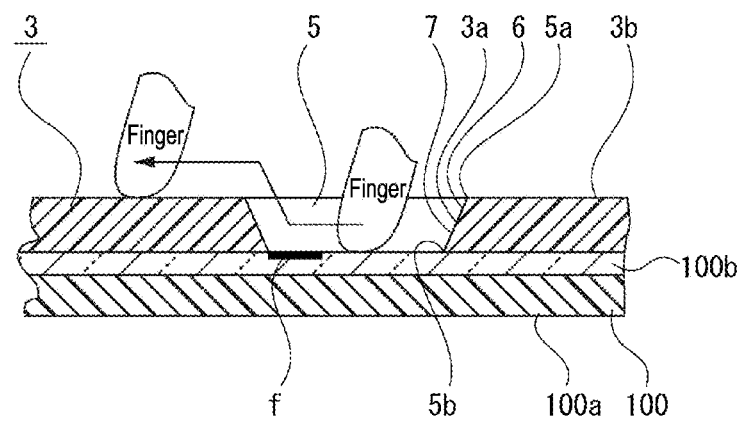

Regarding the electronic apparatus cover 1 and the electronic apparatus 100 when a contact operation is performed on the operation position specifying recess 3*a* shown in FIG. 7A, FIG. 7B shows a cross-sectional view thereof. Specifically, FIG. 7B shows a state where a fingertip of the operator moves from the display surface 100*b* exposed to the through-holes h1, h2 located at the center of the operation position specifying recess 3*a* to the outside of the operation position specifying recess 3*a* (on the base 3*b*).

The electronic apparatus 100 detects a contact operation, which passes from right toward left on a specific region f on the display surface 100*b* set by a program, on the basis of a change in capacitance. At that time, the application installed in the electronic apparatus 100 so as to execute a specific function is configured (programmed) such that a specific function is executed when the contact operation passes from right toward left on the region f.

It should be noted that an icon for executing a specific function may be displayed in the region f. This makes it easy to understand a specific function to be executed in a case where the operator looks at the display surface 100*b* and performs an operation.

It should be noted that the electronic apparatus 100 may be capable of detecting a contact operation with respect to the operated surface 7 in the region f. In this case, for example, a specific function is executed by a contact operation of touching only the operated surface 7.

Further, the region f may be provided to the rear side of the circumferential portion 5. In this case, a specific function may be executed when an operation passes on the region f from right to left, or a specific function may be executed by a contact operation with respect to only the operated surface 7 of the circumferential portion 5.

3-1. First Example

In a first example in the operation examples of application, an application for playing music (hereinafter referred to as "music playing application") will be described.

First, when detecting the close state of the display surface 100*b*, the electronic apparatus 100 executes processing of activating a music playing application.

Figure 8:
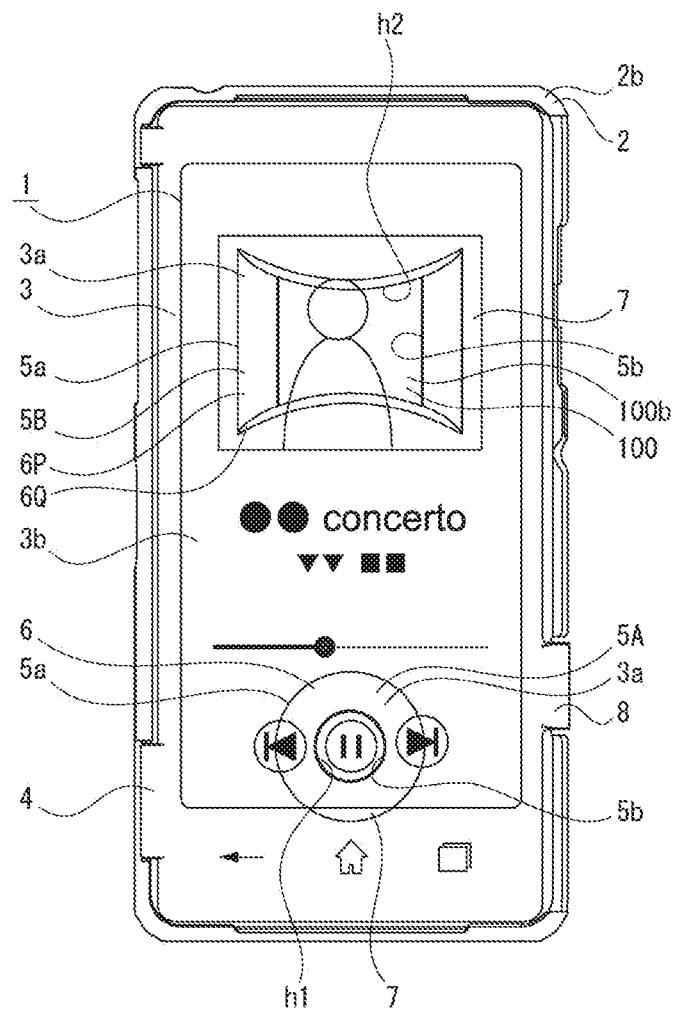
FIG. 8 is a front view of the electronic apparatus and the electronic apparatus cover in a state where a music playing application is activated.

FIG. 8 shows a state where a music playing application is activated in the close state.

It should be noted that the material of the display surface 100*b* may be transparent such that information displayed on the display surface 100*b* can be visually recognized, or may be opaque such that only information displayed at positions corresponding to the through-holes h1, h2 in the display surface 100*b* can be visually recognized.

FIG. 8 is shown as a perspective view for simplicity.

As shown in the figure, various types of information displayed on the display surface 100*b* of the electronic apparatus 100 can be visually recognized via the base 3*b* or the operation position specifying recess 3*a* of the electronic apparatus cover 1. Additionally, the electronic apparatus 100 can execute a specific function corresponding to a contact operation with respect to a part of the region of the display surface 100*b*, which is exposed to the through-holes h1, h2 provided at the center of the operation position specifying recess 3*a*, or with respect to a part of the region of the operated portion 6.

Figure 9:
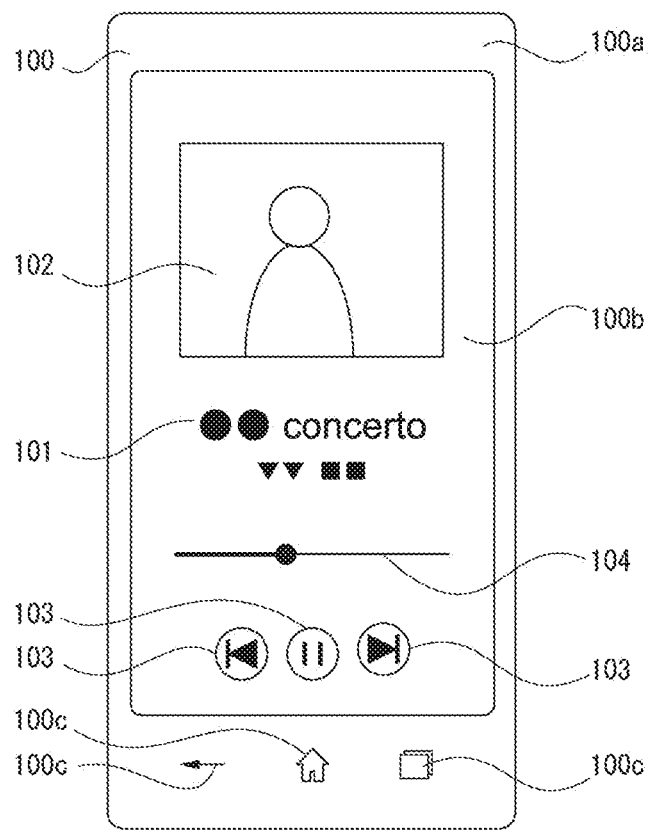
FIG. 9 is a front view of the electronic apparatus in the state where the music playing application is activated.

For easy description, FIG. 9 shows only the electronic apparatus 100 in a state where the music playing application is activated.

The display surface 100b displays track information 101 including the title of a track, the name of a singer, and the like regarding a track being played, image information 102 regarding the track being played, operation icons 103, 103, . . . that are electronic operation elements for performing various operations such as pause and fast-forward for the track being played, a seek bar 104 indicating a playing position and the length of the track.

Hereinafter, an operation in a case where the operator operates the operated portion 6 will be described.

Figure 10:
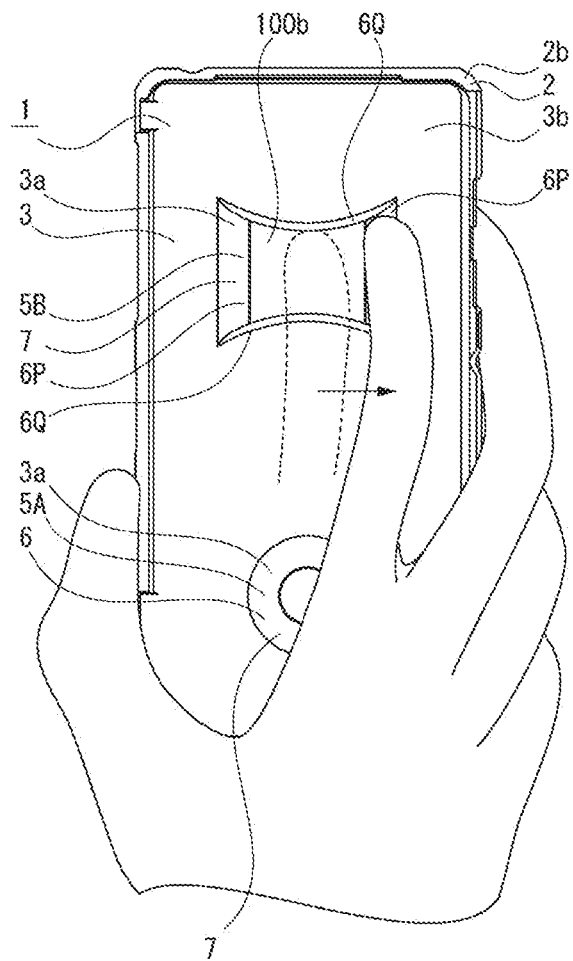
FIG. 10 is a front view showing a state where a contact operation is performed.

FIG. 10 shows a state where the operator performs a contact operation (swipe operation) crossing the right-side first operated portion 6P out of the two first operated portions 6P, 6P in the circumferential portion 5B. When this contact operation is performed, the music playing application installed in the electronic apparatus 100 specifies a position at which the contact operation is performed and also specifies an operation direction. In the example shown in FIG. 10, the music playing application detects that the operation is performed on the first operated portion 6P of the circumferential portion 5B of the operation position specifying recess 3a provided on the upward side, and also specifies that the operation direction of the swipe operation is rightward.

Additionally, the music playing application executes a specific function such as a skip forward function of starting to play the next track according to the operation position and the operation type (swipe operation, tap operation, etc.). When the next track is started to play, the image information 102 also changes to an image corresponding to the next track.

The two first operated portions 6P, 6P in the circumferential portion 5B are operated portions for executing a first function. The first function in the example of FIG. 10 refers to a "skip forward/skip backward function". In other words, the electronic apparatus 100 executes the "skip forward function" when receiving an operation with respect to one of the first operated portions 6P. The electronic apparatus 100 executes the "skip backward function" when receiving an operation with respect to the other first operated portion 6P.

Therefore, in a case where a swipe operation (which may be a flick operation, a tap operation, or the like) is performed on the left-side first operated portion 6P in the circumferential portion 5B, the electronic apparatus 100 executes the skip backward function.

An example of another contact operation with respect to the circumferential portion 5B provided on the upward side of the base 3b will be described with reference to FIG. 11.

Figure 11:
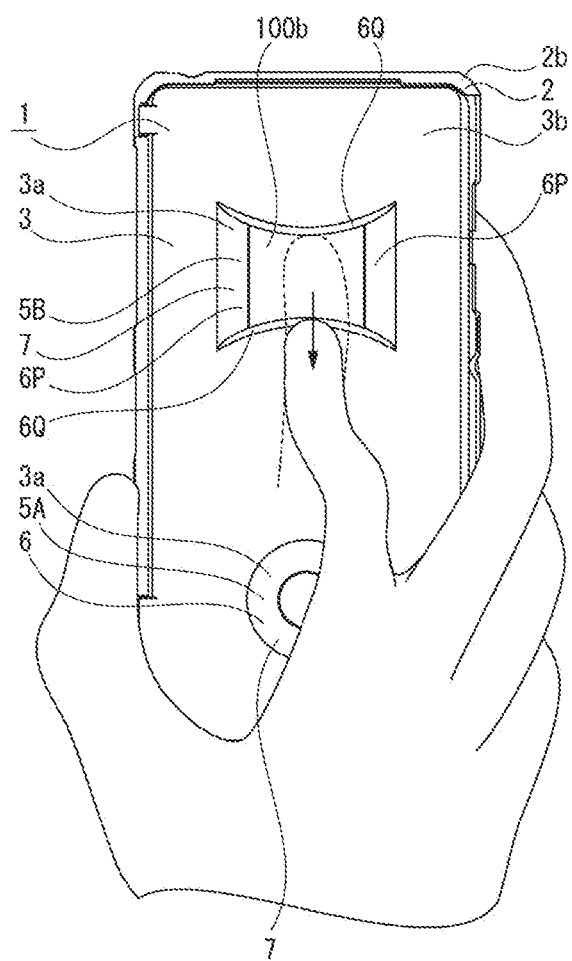
FIG. 11 is a front view showing a state where another contact operation is performed.

FIG. 11 shows a state where an operator performs a contact operation (swipe operation) on the lower-side second operated portion 6Q out of the two second operated portions 6Q, 6Q in the circumferential portion 5B.

When the contact operation is performed, the music playing application installed in the electronic apparatus 100 executes a second function according to the operation position and the operation direction specified on the basis of the contact operation.

It should be noted that the first function and the second function may be executed only when the operation direction of the contact operation is a specific direction or may be executed even when the operation direction of the contact operation is any operation direction.

A sound volume adjusting function will be described as an example of the second function.

The two second operated portions 6Q, 6Q in the circumferential portion 5B are operated portions for executing the second function. In other words, the electronic apparatus 100 executes a "volume up function" when receiving an operation with respect to one of the second operated portions 6Q. The electronic apparatus 100 executes a "volume down function" when receiving an operation with respect to the other second operated portion 6Q.

Specifically, as shown in FIG. 11, the electronic apparatus 100 executes the volume up function when a swipe operation or the like is performed on the upper-side second operated portion 6Q in the circumferential portion 5B, and the electronic apparatus 100 executes the volume down function when a swipe operation or the like is performed on the lower-side second operated portion 6Q.

Subsequently, description will be given on an example of a contact operation with respect to the downward-side operated portion 6 out of the two operation position specifying recesses 3a, 3a provided to the base 3b of the electronic apparatus cover 1.

The downward-side operated portion 6 is provided for executing a single function. In other words, the downward-side operated portion 6 can execute the same function irrespective of the operation direction.

Figure 12:
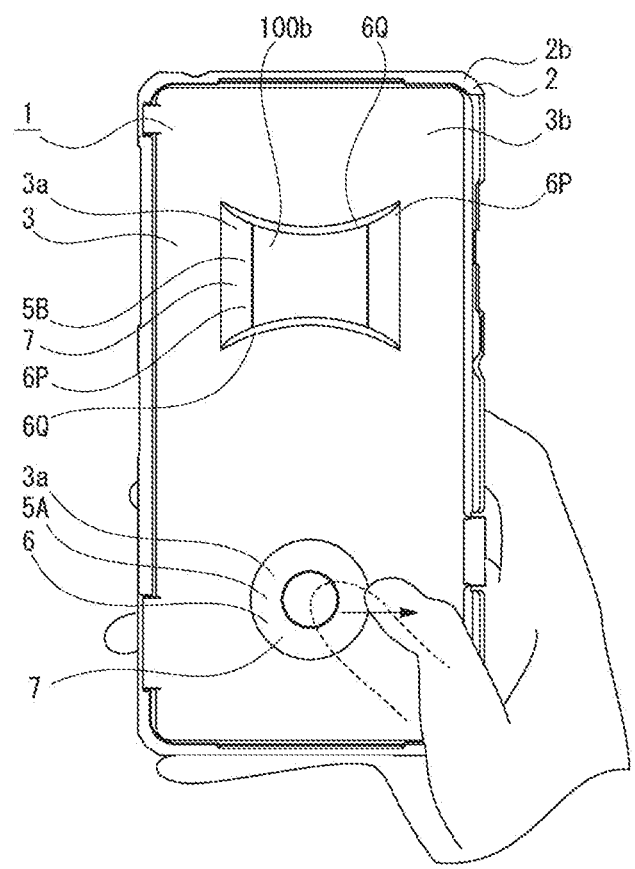
FIG. 12 is a front view showing a state where still another contact operation is performed.

As shown in FIG. 12, in a case where a rightward swipe operation is performed on the downward-side operated portion 6, for example, the electronic apparatus 100 executes a "play/pause switching function" as a corresponding function.

In other words, in a case where the music playing application is playing a track, play of the track is paused. Further, during the pause, the track is to be played from the paused state.

It should be noted that regarding the operated portion 6 of the circumferential portion 5A, a similar function is executed even when a swipe operation in a different operation direction is performed.

In the first example, in a case where a contact operation with respect to the first operated portion 6P or the second operated portion 6Q of the operation position specifying recess 3a disposed on the upward side of the cover portion 3, or a contact operation with respect to the operated portion 6 of the operation position specifying recess 3a disposed on the downward side is detected, diverse examples including the above examples are conceivable as the functions to be executed by the electronic apparatus 100. The examples are as follows.

Play/pause switching function
Play/stop switching function
sound volume adjusting function
Skip forward/skip backward function
Folder skip forward/folder skip backward function
Random play ON/OFF function
Repeated play ON/OFF function
Equalizer setting switching function
Noise canceling setting ON/OFF function The "folder skip forward/folder skip backward function" is a function of switching a folder currently played, and "folder skip forward" is a function of selecting a track in the next folder. Further, "folder skip backward" is a function of selecting a track in the previous folder.

As another example, the "folder skip forward/folder skip backward function" may be configured to switch a group to be played by executing the "folder skip forward/folder skip backward function", in a case where songs are grouped on the basis of tag information linked to the songs, such album, artist, genre, and age.

The example in which the two operated portions (first operated portions 6P, 6P, and second operated portions 6Q, 6Q) for executing one of the two functions are provided to the circumferential portion 5B of the upward-side operation position specifying recess 3a out of the operation position specifying recesses 3a, 3a provided to the electronic apparatus cover 1 has been described with reference to FIGS. 10 to 12. However, the electronic apparatus cover 1 may include an operated portion for executing three or more functions.

Figure 13:
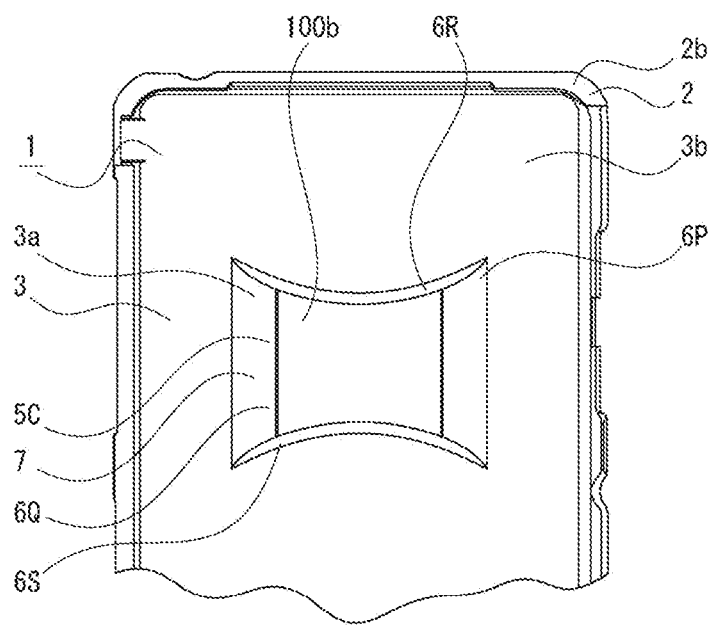
FIG. 13 is a front view showing in an enlarged manner the operation position specifying recess disposed on the upward side of the electronic apparatus cover.

FIG. 13 shows an example in which the electronic apparatus cover 1 includes an operated portion for executing three or more functions. FIG. 13 is an enlarged view of the operation position specifying recess 3a provided on the upward side.

The operation position specifying recess 3a shown in the figure includes a circumferential portion 5C including a first operated portion 6P, a second operated portion 6Q, a third operated portion 6R, and a fourth operated portion 6S that are assigned to have four different functions.

For example, in a case where a contact operation with respect to the first operated portion 6P is performed, the "skip forward/skip backward function" is executed. Here, whether to perform skipping forward or skipping backward depends on the operation direction.

Figure 14:
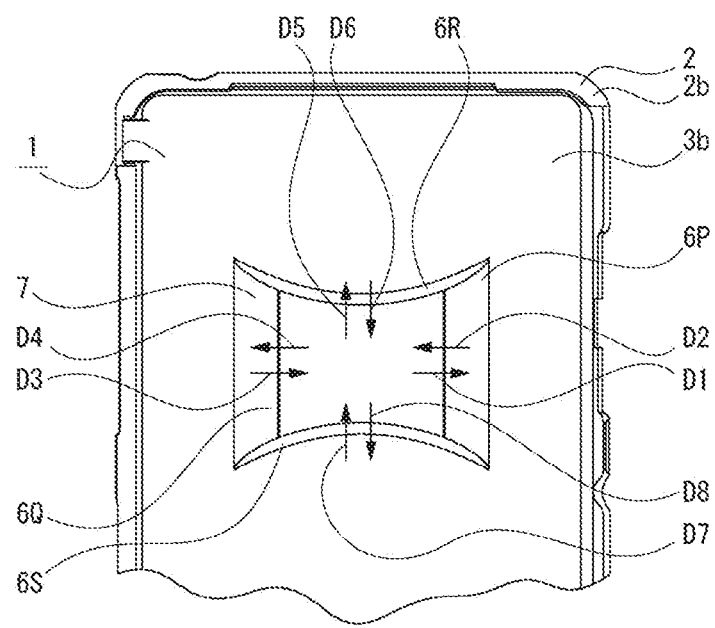
FIG. 14 is a diagram for describing an operation direction of a contact operation with respect to the operation position specifying recess.

The arrows shown in FIG. 14 each indicate motion of a finger from the start point to the end point of a swipe operation.

In a case where a swipe operation to be an operation direction D1 is performed on the first operated portion 6P, the electronic apparatus 100 performs skipping forward. Further, in a case where a swipe operation to be an operation direction D2 is performed, the electronic apparatus 100 performs skipping backward.

The "play/pause switching function" is assigned to the second operated portion 6Q. Processing to be performed similarly depends on the operation direction.

In other words, in a case where a swipe operation to be an operation direction D3 is performed on the second operated portion 6Q, the electronic apparatus 100 plays a track. Further, in a case where a swipe operation to be an operation direction D4 is performed, the electronic apparatus 100 pauses the track.

It should be noted that ON/OFF may be toggled without specifying the operation direction in a case where a function of switching between two states, such as a function of turning ON/OFF a certain function, is assigned.

In a case where the operation direction determines a function to be executed, the operator can perform an intended operation without taking into account the current state. For example, even when any operation of the rightward swipe operation and the leftward swipe operation is performed, a predetermined function is executed irrespective of the current state.

Further, a predetermined function may be executed irrespective of the operation direction. In this case, it is unnecessary to learn a relationship between the operation direction and the content of the function, which facilitates the operation.

The "random play ON/OFF function" is assigned to the third operated portion 6R.

In a case where a swipe operation to be an operation direction D5 is performed on the third operated portion 6R, the electronic apparatus 100 performs processing of turning ON random play. Further, in a case where a swipe operation to be an operation direction D6 is performed, the electronic apparatus 100 performs processing of turning OFF random play.

The "repeated play ON/OFF function" is assigned to the fourth operated portion 6S.

In a case where a swipe operation to be an operation direction D7 is performed on the fourth operated portion 6S, the electronic apparatus 100 performs processing of turning ON repeated play. Further, in a case where a swipe operation to be an operation direction D8 is performed, the electronic apparatus 100 performs processing of turning OFF repeated play.

It should be noted that two functions may be assigned to the single operated portion 6.

For example, the "random play ON/OFF function" and the "noise canceling setting ON/OFF function" may be assigned to the fourth operated portion 6S.

For example, in a case where a swipe operation to be an operation direction D7 is performed, the electronic apparatus 100 executes processing of toggling ON and OFF of random play. Further, in a case where a swipe operation to be an operation direction D8 is performed, the electronic apparatus 100 executes processing of toggling ON and OFF of noise canceling setting.

3-2. Second Example

In a second example in the application operations, an application for performing destination guidance or route guidance in vehicle traveling (hereinafter referred to as "car navigation application") will be described.

Figure 15:
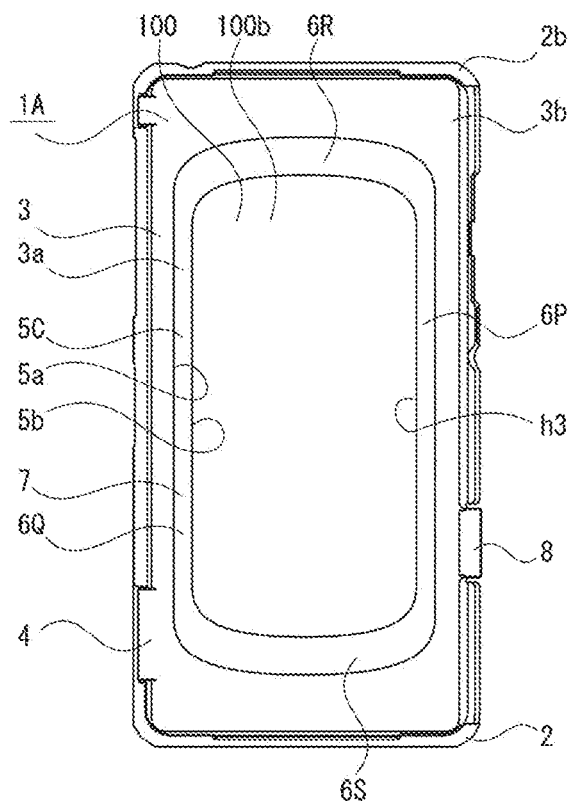
FIG. 15 is a front view of an electronic apparatus cover in a second example.

As shown in FIG. 15, an electronic apparatus cover 1A in the second example is different from the former electronic apparatus cover 1 in that the base 3b includes a single substantially rectangular operation position specifying recess 3a.

The circumferential portion 5C of the operation position specifying recess 3a is substantially rectangular, and an upper edge portion thereof has a gentle curved shape upwardly projecting, and a lower edge portion thereof has a gentle curved shape downwardly projecting.

Further, the inner side of the inner circumferential edge 5b is a through-hole h3.

In the circumferential portion 5C, the right-side portion is a first operated portion 6P, the left-side portion is a second operated portion 6Q, the upper-side portion is a third operated portion 6R, and the lower-side portion is a fourth operated portion 6S.

In the electronic apparatus cover 1A, a function to be executed differs depending on which operated portion in the circumferential portion 5C is operated.

Figure 16:
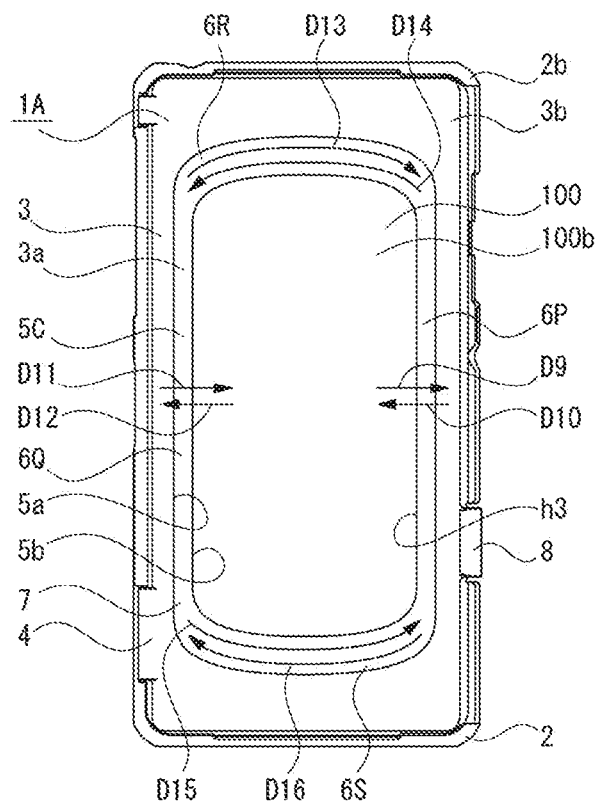
FIG. 16 is a diagram for describing an operation direction of a contact operation with respect to the operation position specifying recess in the second example.

An example regarding a relationship between a contact operation with respect to the circumferential portion 5C and a function to be executed will be described with reference to FIG. 16.

First, when a swipe operation in the right and left direction is performed on the first operated portion 6P being the right-side portion of the circumferential portion 5C, the electronic apparatus 100 executes a "destination setting screen calling function".

Specifically, when a swipe operation D9 in the right direction is performed in a state where map information or route information is displayed on a display surface 100b of the electronic apparatus 100, a screen to set a destination is displayed on the display surface 100b.

Further, when a swipe operation D10 in the left direction is performed in a state where the destination setting screen is displayed, a screen on which the map information is displayed is displayed on the display surface 100*b*.

When a swipe operation in the right and left direction is performed on the second operated portion 6Q being the left-side portion of the circumferential portion 5C, the electronic apparatus 100 executes a "direction switching function".

Specifically, when a swipe operation D11 in the right direction is performed in a state where map information or route information is displayed on the display surface 100*b* of the electronic apparatus 100, the screen is switched to a "north-up mode" in which the upward direction on the map coincides with the north direction.

Further, when a swipe operation D12 in the left direction is performed, the screen is switched to a "heading-up mode" in which the upward direction on the map coincides with the traveling direction of the vehicle.

When swipe operations D13, D14 in the right and left direction are performed on the third operated portion 6R being the upper-side portion of the circumferential portion 5C, i.e., swipe operations along the longitudinal direction of the third operated portion 6R are performed, the electronic apparatus 100 executes a "map scale changing function".

Specifically, when a swipe operation D13 in the right direction is performed in a state where the map information is displayed on the display surface 100*b* of the electronic apparatus 100, the map is enlarged. Further, when a swipe operation D14 in the left direction is performed, the map is contracted.

In the swipe operations D13, D14, the amount of change in magnification percentage is favorably changed according to the amount of operation by the operator.

When swipe operations in the right and left direction are performed on the fourth operated portion 6S being the lower-side portion of the circumferential portion 5C, the electronic apparatus 100 executes a "navigation sound volume changing function". The navigation sound volume refers to the sound volume of sound output performed by the electronic apparatus 100 for navigation.

Specifically, when a swipe operation D15 in the right direction is performed in a case where the electronic apparatus 100 is performing sound output for the route guidance, the navigation sound volume rises. Further, when a swipe operation D16 in the left direction is performed, the navigation sound volume decreases.

In the swipe operations D14, D15, the amount of change in sound volume is favorably changed according to the amount of operation by the operator.

In the second example, in a case where an operation with respect to the first operated portion 6P, the second operated portion 6Q, the third operated portion 6R, or the fourth operated portion 6S is detected, diverse examples including the above examples are conceivable as the functions to be executed by the electronic apparatus 100. The examples are as follows.

Destination setting screen calling function
Direction switching function
3D (bird's-eye view)/2D (planar map) switching function
Map scale changing function
Navigation sound volume changing function
Map center position changing function
Navigation start/stop switching function
Function of setting destination to registered spot In particular, the "map scale changing function", the "navigation sound volume changing function", or the like is suitable as a function to be executed when detecting an operation with respect to the operated portion 6 on which a swipe operation having a large operation amount can be performed. Therefore, the electronic apparatus 100 may execute the "map scale changing function" or the "navigation sound volume changing function" according to a swipe operation in the up and down direction with respect to the first operated portion 6P or the second operated portion 6Q.

Further, in a case where the electronic apparatus 100 can simultaneously execute a plurality of applications, the above-mentioned swipe operation can also be assigned to a function of another application running on the background.

For example, when the swipe operation with respect to the first operated portion 6P is performed, the "skip forward/skip backward function" of the music playing application running on the background may be executed.

Each of the functions described above may be assigned to any of the operated portions 6P, 6Q, 6R, 6S.

Further, a plurality of functions may be assigned to a single operated portion 6. For example, the "destination setting screen calling function" may be assigned to a swipe operation in the right and left direction with respect to the first operated portion 6P, and the "map scale changing function" may be assigned to a swipe operation in the up and down direction.

Further, a different function may be assigned to each screen displayed on the display surface 100*b*.

3-3. Third Example

In a third example in the application operations, an application with character input will be described.

Figure 17:
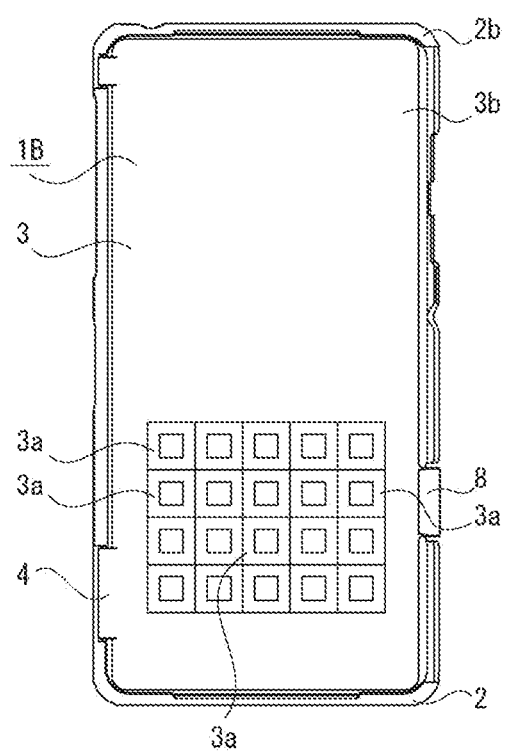
FIG. 17 is a front view of an electronic apparatus cover in a third example.

As shown in FIG. 17, an electronic apparatus cover 1B in the third example is different from the former electronic apparatus covers 1, 1A in that the base 3*b* includes a lot of substantially rectangular operation position specifying recesses 3*a*.

Specifically, as shown in the figure, 20 operation position specifying recesses 3*a*, 3*a*, . . . are provided in a 5 columns by 4 rows matrix, for example.

A through-hole h4 is formed at the center of the operation position specifying recess 3*a*.

Figure 18:
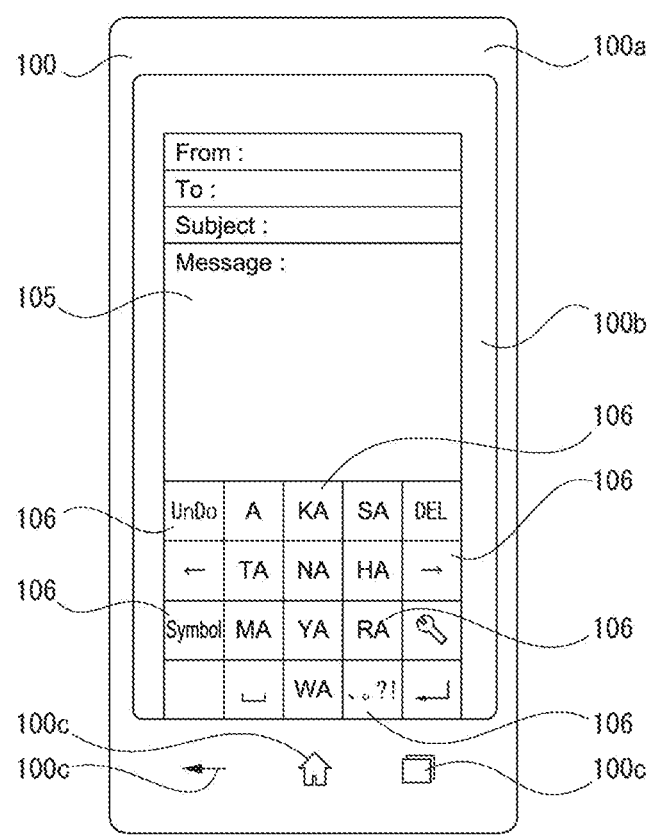
FIG. 18 is a front view of an electronic apparatus showing a state where an application in the third example is activated.

FIG. 18 shows an e-mail creation screen as an example of information to be displayed on the display surface 100*b*.

In the e-mail creation screen, an input field 105 in which an address and a text of the e-mail in process of creation are displayed is provided in substantially the upper half portion, and input/function icons 106, 106, . . . that select characters to be input and a function are provided in substantially the lower half portion. The function is, for example, a function of changing an input character type or of determining an input character string.

For example, any character of "A", "I", "U", "E", and "O" can be input according to a contact operation with respect to the input/function icon 106 on which "A" is displayed.

Further, a function of moving a cursor position to right can be executed according to an operation with respect to the input/function icon 106 on which "→" is displayed.

Figure 19A:
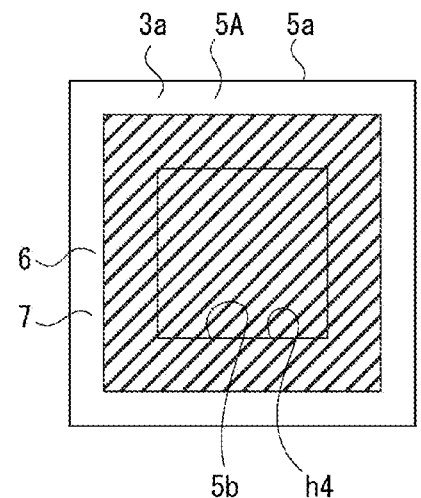
FIGS. 19A and 19B are diagrams for describing an operation direction of a contact operation with respect to the operation position specifying recess in the third example.
Figure 19B:
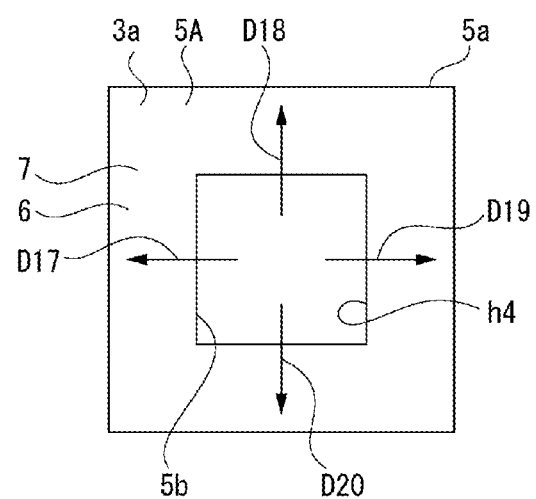

FIG. 19A and FIG. 19B show one of the 20 operation position specifying recesses 3*a*, 3*a*, . . . in an enlarged manner.

As shown in the figures, the circumferential portion 5A of the single operation position specifying recess 3*a* includes an operated portion 6 for executing a single function.

In the third example, a "character input function" will be described as a function to be executed on the basis of an operation by the operator with respect to the circumferential portion 5A. Furthermore, in the third example, an example in which different types of processing are performed on the basis of the start point and the end point of the operation will be described.

In the operation position specifying recess 3a, the electronic apparatus 100 can detect a contact operation by the operator in a part of the region between the outer circumferential edge 5a and the inner circumferential edge 5b, as shown with hatched lines in FIG. 19A.

FIG. 19B illustrates an example of the operation position and the operation direction by the operator. Specifically, FIG. 19B shows a single flick operation per arrow. Additionally, the start point of the arrow indicates the start point of the flick operation, and the end point of the arrow indicates the end point of the flick operation.

For example, an operation to be an operation direction D17 means that a flick operation is performed from the inner side of the circumferential portion 5A toward the left direction.

Additionally, regarding a flick operation performed from the region of the circumferential portion 5A toward the through-hole h4 on the inner side, as no arrow is illustrated, the electronic apparatus 100 is configured to not execute a corresponding function.

It should be noted that a tap operation with respect to a portion of the display unit 100b, which is exposed in the through-hole h4 and is the region on the inner side of the circumferential portion 5A, is allowed.

A contact operation with respect to the single circumferential portion 5A will be described with reference to FIG. 19B. Hereinafter, a case where "A line" in Japanese is input as character input and a case where the cursor position is moved to right will be described as an example.

When detecting a tap operation with respect to the region on the inner side of the circumferential portion 5A, the electronic apparatus 100 displays a Japanese character "A" at a predetermined position of the display unit 100b. The predetermined position refers to, for example, a position in the text that is voluntarily selected by the operator because the operator wants to input a character.

When detecting a flick operation D17 from the region on the inner side of the circumferential portion 5A toward the leftward direction, the electronic apparatus 100 displays a character "I" at a predetermined position of the display unit 100b.

When detecting a flick operation D18 from the region on the inner side of the circumferential portion 5A toward the upward direction, the electronic apparatus 100 displays a character "U" at a predetermined position of the display unit 100b.

When detecting a flick operation D19 from the region on the inner side of the circumferential portion 5A toward the rightward direction, the electronic apparatus 100 displays a character "E" at a predetermined position of the display unit 100b.

When detecting a flick operation D20 from the region on the inner side of the circumferential portion 5A toward the downward direction, the electronic apparatus 100 displays a character "O" at a predetermined position of the display unit 100b.

A contact operation with respect to an operation position specifying recess 3a other than the operation position specifying recesses 3a for selecting characters to be input will be described. For example, this contact operation is a contact operation with respect to an operation position specifying recess 3a for selecting a function, or a contact operation with respect to the input/function icon 106 on which "→" shown in FIG. 18 is displayed.

In a case where a contact operation with respect to the input/function icon 106 on which "→" is displayed is performed, the electronic apparatus 100 executes a function of moving the cursor position to right irrespective of the operation direction of the contact operation with respect to the circumferential portion 5A.

It should be noted that the circumferential portions 5 of the adjacently disposed operation position specifying recesses 3a may be configured to have different shapes or the like in a case where the plurality of operation position specifying recesses 3a, 3a, 3a . . . are provided as in this example.

For example, a rectangular circumferential portion 5 and a circular circumferential portion 5 may be adjacently disposed. Circumferential portions 5, 5 having different inclined angles of the operated surface 7 to the base 3b may be adjacently disposed. Alternatively, circumferential portions 5, 5 that are different in the presence/absence or the shape of a recess portion or projecting portion provided to the operated surface 7, which is to be described later, may be adjacently disposed.

With this configuration, the operator can easily grasp on which one of the adjacent operation position specifying recesses 3a, 3a a contact operation is performed, in a state where the operator cannot look at the display surface 100b or the base 3b, and can easily execute a specific function.

4. POSITION CORRECTION

Next, position correction of the electronic apparatus cover 1 to the electronic apparatus 100 will be described.

In the close state, a relative position relationship between the operation position specifying recess 3a provided to the cover portion 3 of the electronic apparatus cover 1 and the operation region of the display surface 100b in the electronic apparatus 100 is important.

In a case where the relative positions are shifted on both sides, there is a possibility that, when the operator performs a contact operation with respect to the operated portion 6 of the operation position specifying recess 3a, the contact operation is detected in an operation region that is not intended by the operator and an unintended function is executed.

In order to avoid this situation, it is desirable to perform the following position correction.

Hereinafter, a configuration of the electronic apparatus cover 1 for performing the position correction and the processing of the electronic apparatus 100 will be described.

4-1. Configuration of Electronic Apparatus Cover

Figure 20:
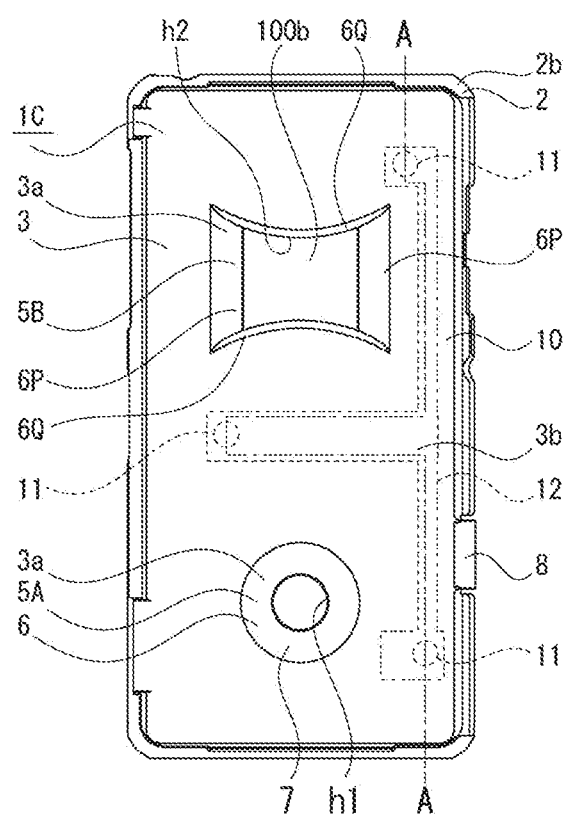
FIG. 20 is a front view showing an electronic apparatus cover including reference position specifying portions and the electronic apparatus.
Figure 21A:
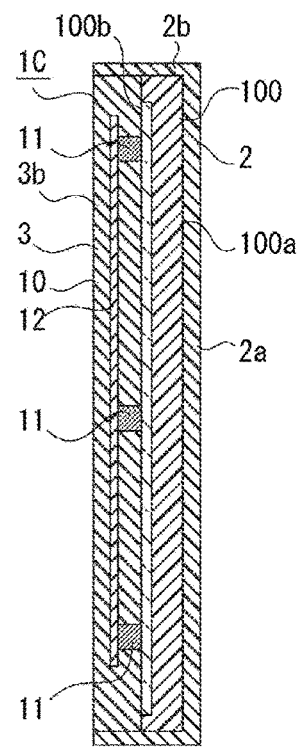
FIGS. 21A and 21B are cross-sectional views of the electronic apparatus cover including the reference position specifying portions and the electronic apparatus.

FIGS. 20 and 21A show an electronic apparatus cover 1C in this example.

FIG. 21A is a cross-sectional view taken along the chain line A-A shown in FIG. 20.

The electronic apparatus cover 1C is different from the former electronic apparatus covers 1, 1A, 1B in that the electronic apparatus cover 1C includes a member for changing a capacitance that can be detected via an electrode array provided to the rear side of the display surface 100b when the cover portion 3 comes close to the display surface 100b.

It should be noted that the arrangement form of the operation position specifying recesses 3a, 3a of the electronic apparatus cover 1C is similar to that of the electronic apparatus cover 1.

The base 3b in the electronic apparatus cover 1C includes an insulation portion 10 formed of an insulation member, reference position specifying portions 11, 11, 11 for changing a capacitance when coming close to the display surface 100b, and a detection reinforcing portion 12 disposed in contact with the front surfaces of the three reference position specifying portions 11, 11, 11.

The detection reinforcing portion 12 is configured to come into contact with a target having a sufficient capacitance, such as a hand of the operator, in the operation of opening/closing the cover portion 3.

It should be noted that the number of reference position specifying portions 11 may be four or more. In the following description, an example of the electronic apparatus cover 1C including the three reference position specifying portions 11 will be described.

The reference position specifying portions 11, 11, 11 are provided inside the base 3b.

A material that can change a capacitance is used as the reference position specifying portions 11. Examples of such a material include an electrically conductive silicon, an electrically conductive rubber, an electrically conductive elastomer, metal, and carbon.

The base 3b in which the reference position specifying portions 11 are embedded is formed by so-called insert molding or the like.

Further, in a case where the base 3b is configured by lamination of a plurality of materials, the lamination may be performed such that a space for embedding the reference position specifying portions 11 is formed, thus forming the base 3b including the reference position specifying portions 11 disposed therein.

The detection reinforcing portion 12 is a member for increasing a change in capacitance when coming close to the display surface 100b, and is formed of a material similar to that of the reference position specifying portions 11. When the reinforcing portion 12 is provided to the base 3b, the close state is easily detected. Further, since the detection reinforcing portion 12 can increase a change in capacitance, the selection range of the material of the reference position specifying portions 11 can be extended.

When the open state is changed to the close state, the cover portion 3 comes close to the display surface 100b, and thus a capacitance changes. The electronic apparatus 100 detects this change in capacitance and recognizes that the state is changed to the close state.

It should be noted that the insulation portion 10 of the base 3b is desirably formed of an opaque member in a case where the detection reinforcing portion 12 embedded in the base 3b is not formed of a transparent member.

When the insulation portion 10 is formed of an opaque member, the detection reinforcing portion 12 can be prevented from being seen from the outside, so that the appearance of the electronic apparatus cover 1D can be improved.

Figure 21B:
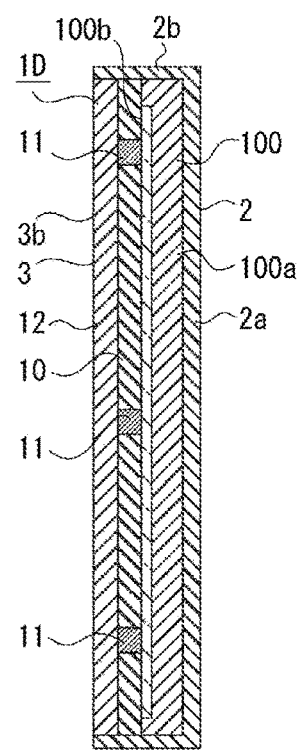

FIG. 21B shows an electronic apparatus cover 1D as another form of the electronic apparatus cover 1C.

FIG. 21B is a cross-sectional view taken along the chain line A-A shown in FIG. 20.

In the electronic apparatus cover 1D, all the portion, in the base 3b, positioned forward relative to the reference position specifying portions 11, 11, 11, is the detection reinforcing portion 12.

In this case, since a cubic volume of the detection reinforcing portion 12 increases, the change in capacitance can further increase. Thus, the selection range of the material of the reference position specifying portions 11 can be extended.

It should be noted that in a case where the detection reinforcing portion 12 is formed of a material heavier than the material of the insulation portion 10, such as metal, reduction in weight of the cover portion 3 can be achieved by forming the detection reinforcing portion 12 at a part of the portion positioned forward relative to the reference position specifying portions 11, 11, 11, as shown in FIG. 21A.

Further, when the detection reinforcing portion 12 comes into contact with a target having a sufficient capacitance in the operation of opening/closing the cover portion 3, the operation of opening/closing the cover portion 3 can be reliably detected.

It should be noted that the bases 3b of the electronic apparatus covers 1C, 1D may not include the detection reinforcing portion 12 in a case where a capacitance can be sufficiently changed by using only the reference position specifying portions 11.

When the display surface 100b of the electronic apparatus 100 detects a contact (approximation) of the reference position specifying portions 11, the mounting of the electronic apparatus cover 1 to the electronic apparatus 100 is grasped.

In general, in order to determine whether the cover portion 3 is mounted or not, a magnet or the like is provided to the electronic apparatus 100, and the detection using the magnet is performed.

However, as in this configuration, a method of detecting that the reference position specifying portions 11 provided to the cover portion 3 come into contact with the display surface 100b can be achieved by using software that operates on the electronic apparatus 100.

In other words, since the electronic apparatus 100 does not need to include the magnet or the like, reduction in number of components and in cost can be achieved. Additionally, since it is unnecessary to prepare a dedicated electronic apparatus 100 including a magnet in order to support the various electronic apparatus covers 1 described above, general versatility of the electronic apparatus cover 1 can be enhanced.

In particular, since the electronic apparatus 100 such as a mobile phone capable of using various types of software can install software corresponding to the electronic apparatus cover 1 having this configuration, such an electronic apparatus 100 is suitable as a target of the electronic apparatus cover 1.

Further, a relative position of the cover portion 3 to the display surface 100b is grasped. In other words, a relative position of the circumferential portion 5 being the operated portion 6 to the display surface 100b is also grasped.

Therefore, it is possible to determine whether the operation by the operator is performed on the operated portion 6 or not, and also to reliably execute a specific function corresponding to the operated portion 6. In particular, when the three reference position specifying portions 11 are provided, the accuracy of detecting a position of the operated portion 6 can be enhanced, and the accuracy of position correction can also be enhanced.

Furthermore, when at least three reference position specifying portions 11 are provided, a malfunction due to an unintended contact of a finger can be suppressed.

4-2. Processing of Electronic Apparatus

Processing regarding the position correction executed by the electronic apparatus 100 according to the operation of opening/closing the cover portion 3 will be described.

Figure 22:
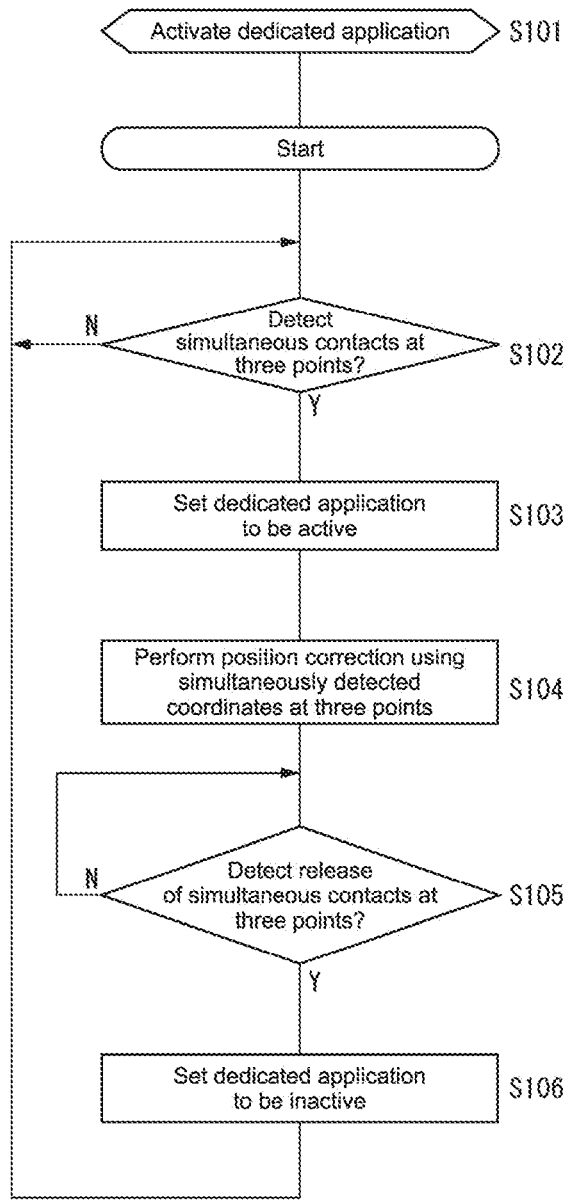
FIG. 22 is a flowchart of processing regarding position correction.

FIG. 22 shows a flowchart regarding the processing executed by the electronic apparatus 100.

First, the electronic apparatus 100 activates a dedicated application in advance in Step S101 as preprocessing of performing the processing regarding position correction.

For example, in a case where the electronic apparatus 100 is a smartphone, a dedicated application is set to be activated at the time of power-on of the smartphone. Thus, the processing of Step S101 is executed as preprocessing.

The electronic apparatus 100 executes processing regarding position correction, which will be described later, in a state where the processing of Step S101 is executed and the activation of the dedicated application is completed.

In Step S102, the electronic apparatus 100 determines whether simultaneous contacts at three points of the reference position specifying portions 11, 11, 11 to the display unit 100b are detected or not. The electronic apparatus 100 executes the processing of Step S102 until simultaneous contacts on the display surface 100b are detected.

When detecting the simultaneous contacts at three points, the electronic apparatus 100 performs processing of setting the dedicated application to be active in Step S103. For example, in an example of the music playing application, such processing corresponds to processing of displaying a UI (User Interface) for using the music playing application shown in FIG. 9 on the display surface 100b.

It should be noted that the number of simultaneous contacts corresponding to the number of reference position specifying portions 11 is detected in a case where the electronic apparatus cover 1 includes four or more reference position specifying portions 11 as described above.

Subsequently, in Step S104, the electronic apparatus 100 performs position correction using the simultaneously detected coordinates at three points. This processing is executed because the relative position of the cover portion 3 to the display surface 100b is not always the same in the close state. In other words, this processing is for executing processing following the intension of the operation by the operator, e.g., for executing processing corresponding to an icon to be pressed by the operator.

When the processing of position correction in Step S104 is executed, the position correction in the right and left direction, in the up and down direction, and of the rotational angle is performed.

This position correction is performed by calculating an offset value for correcting a position at which the operator actually operates, i.e., a position of the operated portion 6 of the operation position specifying recess 3a to a suitable position.

Therefore, in a case where a contact operation is performed on the operated portion 6 in the operation position specifying recess 3a after the position correction is performed, assuming that a contact operation with respect to a corrected position is performed, the corrected position being obtained by adding an offset value to the operation position on which the contact operation is performed, the electronic apparatus 100 can suitably execute a function intended by the operator.

It should be noted that, in a case where the icon or the like is displayed on the display surface 100b according to the position of the operation position specifying recess 3a of the electronic apparatus cover 1D, the position of the icon or the like may be corrected in the position correction processing. With this configuration, operability in a case of operating the icon or the like displayed on the display surface 100b while looking at it can be improved.

Next, in Step S105, the electronic apparatus 100 determines whether the release of the simultaneous contacts at three points on the display surface 100b is detected or not.

The processing of Step S105 is continuously executed until the release of the simultaneous contacts at three points is detected.

It should be noted that the processing of Step S105 may be executed with lower frequency than that of the processing of Step S102.

For example, in a case where the processing of Step S102 is executed at a sampling rate of 60 Hz, the processing of Step S105 may be executed at a sampling rate of 1 Hz (once per second). Reduction in execution frequency can ease the processing load on the electronic apparatus and prevent the processing of the music playing application or the like from being disturbed.

In a case where the release of the simultaneous contacts is detected, the electronic apparatus 100 executes processing of setting the dedicated application to be inactive in Step S106.

It should be noted that the dedicated application is software that executes processing for achieving various functions of the music playing application described above, in addition to the processing of detecting the operation of opening/closing the cover portion 3 and the processing for performing position correction.

Therefore, various types of processing corresponding to the operations by the operator with respect to the operation position specifying recess 3a, e.g., processing related to the execution of the play/pause switching function in the music playing application, are executed separately from and parallel with the processing of the flowchart shown in FIG. 22.

Note that the dedicated application for performing only the processing of detecting the opening/closing operation and the processing of performing the position correction, the music playing application, and the like may be different software. In such a case, the electronic apparatus 100 executes processing of activating the music playing application instead of setting the dedicated application to be active in Step S103, and executes processing of terminating the music playing application instead of setting the dedicated application to be inactive in Step S106.

It should be noted that in a case where the dedicated application, the music playing application, and the like are different software, the reference position specifying portions 11, 11, 11 in a different arrangement form may be provided to the base 3b of each of the electronic apparatus covers 1, 1A, 1B. With this configuration, the dedicated application can detect which of the electronic apparatus covers 1, 1A, 1B is mounted to the electronic apparatus 100 on the basis of the arrangement from of the detected three points. Therefore, the electronic apparatus 100 can execute processing of selecting and activating a suitable application in Step S103.

5. MODIFIED EXAMPLES

5-1. Modified Example of Circumferential Portion

Each example above has described that the operated surface 7 of the circumferential portion 5 (5A, 5B, 5C) of the electronic apparatus cover 1, 1A, 1B, 1C, 1D is a slant surface with a constant inclination with respect to the base 3b (e.g., FIG. 4), but the operated surface 7 is not limited to the shape inclined to the base 3b.

Hereinafter, various modified examples of the shape of the operated surface 7 will be described with reference to respective cross-sectional views.

Figure 23A:
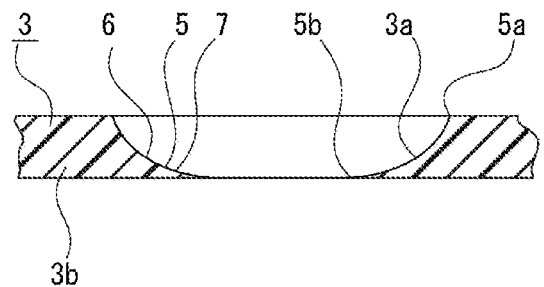
FIGS. 23A, 23B, and 23C are cross-sectional views showing a modified example of a circumferential portion.

First, as shown in FIG. 23A, the operated surface 7 may be a recess surface.

For example, since the degree of inclination given to the fingertip of the operator increases when the fingertip reaches the outer circumferential edge 5a of the circumferential portion 5 from the base 3b, the position of the operation position specifying recess 3a can be easily grasped. Further, a swipe operation whose operation direction is a direction from the outer circumferential edge 5a toward the inner circumferential edge 5b can be easily recognized when it is performed.

Figure 23B:
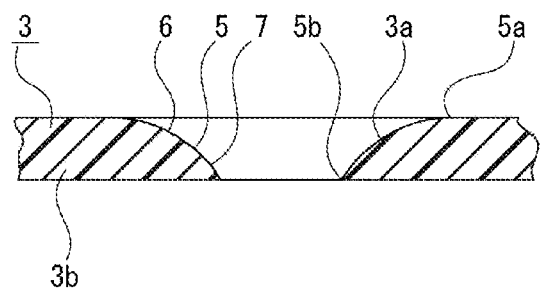

Next, as shown in FIG. 23B, the operated surface 7 may be a projecting surface.

For example, since the degree of inclination given to the fingertip of the operator increases when the fingertip reaches the circumferential portion 5 from a portion of the display surface 100b that is exposed to the through-hole h1 (h2, h3, h4) at the center of the operation position specifying recess 3a, a swipe operation whose operation direction is a direction from the inner circumferential edge 5b toward the outer circumferential edge 5a can be easily recognized when it is performed.

Figure 23C:
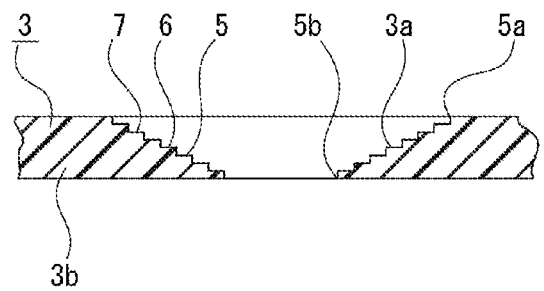

Furthermore, as shown in FIG. 23C, the operated surface 7 of the circumferential portion 5 may include many stepped surfaces.

With this configuration, in a case where the operator performs an operation of sliding a finger on the base 3b, the operator easily grasps, by the stepped surfaces, that the fingertip or the like performing a contact operation reaches the operation position specifying recess 3a.

Further, when a swipe operation or the like is performed, it is easy to recognize that the operation with respect to the operated portion 6 has been performed.

Figure 24A:
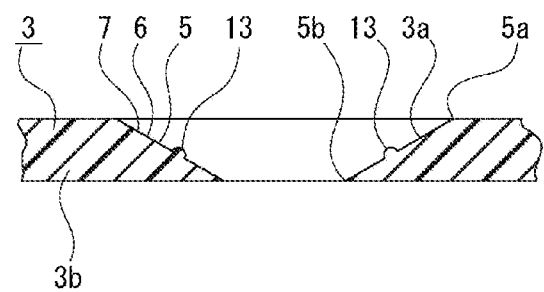
FIGS. 24A and 24B are cross-sectional views showing another modified example of the circumferential portion.

Besides, as shown in FIG. 24A, a projecting portion 13 may be provided to the operated surface 7 of the circumferential portion 5.

With this configuration, the operator easily specifies the position of the circumferential portion 5 and the position of the operation position specifying recess 3a.

Figure 24B:
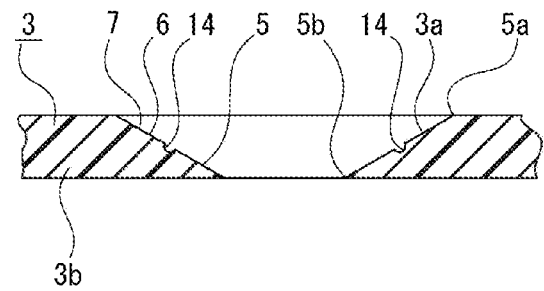

Further, as shown in FIG. 24B, a recess portion 14 may be provided to the operated surface 7 of the circumferential portion 5.

With this configuration, the operator easily specifies the position of the circumferential portion 5 and the position of the operation position specifying recess 3a.

It should be noted that the projecting portion 13 and the recess portion 14 show in FIG. 24A may be provided closer to the outer circumferential edge 5a side in the circumferential portion 5, may be provided closer to the inner circumferential edge 5b side, or may be provided substantially at the center between the outer circumferential edge 5a and the inner circumferential edge 5b.

5-2. Modified Example of Outer Circumferential Edge and Inner Circumferential Edge Each example above has described that the circumferential portion 5 is substantially rectangular or circular as shown in FIGS. 3, 15, 19A, and 19B, but the circumferential portion 5 is not limited to those shapes.

Hereinafter, examples of other shapes of the circumferential portion 5 will be described.

Figure 25A:
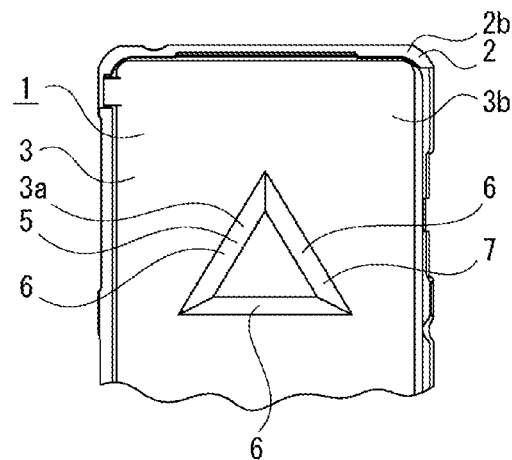
FIGS. 25A, 25B, and 25C are front views showing a modified example of an outer circumferential edge and an inner circumferential edge.

As shown in FIG. 25A, the circumferential portion 5 of the operation position specifying recess 3a may be triangular.

Figure 25B:
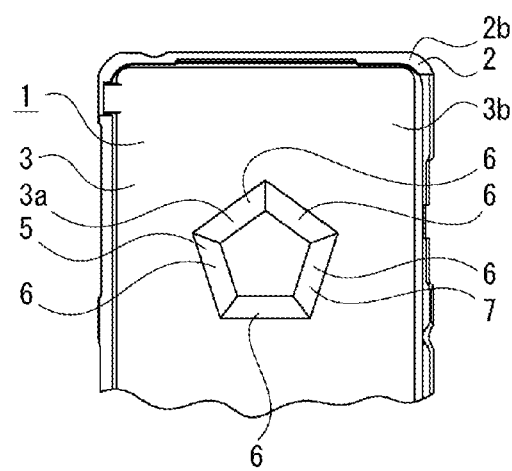

Further, as shown in FIG. 25B, the circumferential portion 5 may be pentagon-shaped. As a matter of course, the circumferential portion 5 may have other polygonal shapes.

Figure 25C:
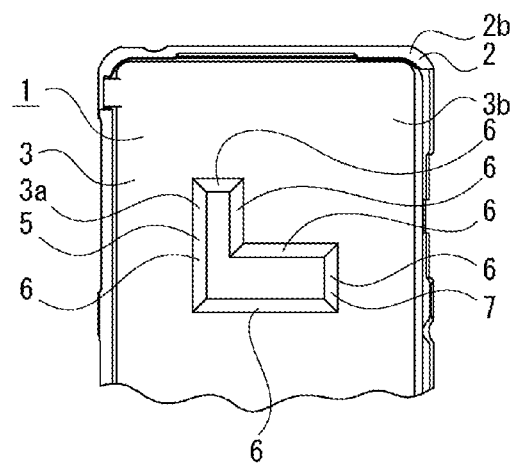

Further, as shown in FIG. 25C, the shape of the circumferential portion 5 may be a shape formed by only linear portions. It should be noted that FIG. 25C shows an L shape as an example.

Figure 26A:
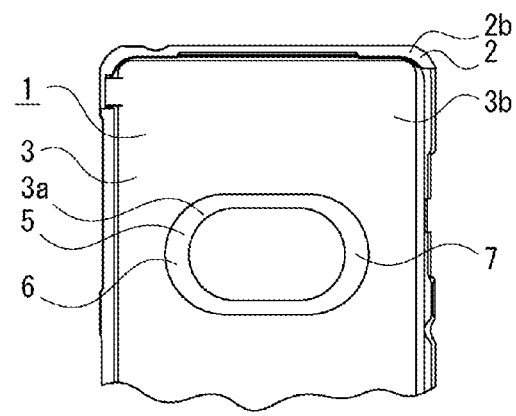
FIGS. 26A and 26B are front views showing another modified example of the outer circumferential edge and the inner circumferential edge.

Additionally, as shown in FIG. 26A, the shape of the circumferential portion 5 may be elliptical or oval. FIG. 26A shows an example of an oval circumferential portion 5.

Figure 26B:
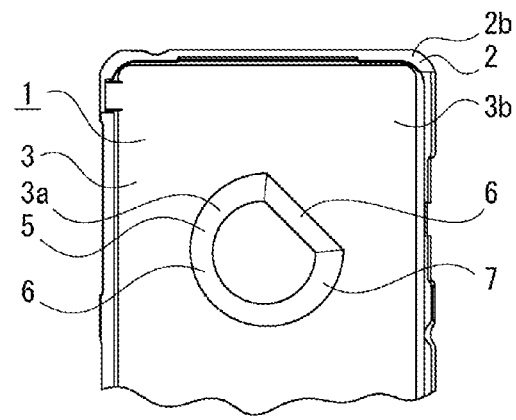

Furthermore, as shown in FIG. 26B, the shape of the outer circumferential edge 5a and the inner circumferential edge 5b may be a shape using a linear portion and a curved portion in combination.

It should be noted that in a case where the base 3b includes a plurality of circumferential portions 5, 5, . . . , each circumferential portion 5 may have a different shape. When the outer circumferential edge 5a and the inner circumferential edge 5b are different from each other in shape, it is easy to grasp which operated portion 6 is being operated when a contact operation with respect to the operated portion 6 is performed with help from a sense of touch.

5-3. Other Modified Examples

In a case where the circumferential portion 5 includes the first operated portion 6P and the second operated portion 6Q, the first operated portion 6P and the second operated portion 6Q may be made different from each other in texture. For example, the first operated portion 6P and the second operated portion 6Q may be formed of different materials. Besides, one of the first operated portion 6P and the second operated portion 6Q may be formed of a smooth flat surface, and the other one may be formed of a flat surface with fine irregularities.

With this configuration, the positions of the first operated portion 6P and the second operated portion 6Q are easily grasped in a case where those positions are grasped with help from only a sense of touch, and the first function and the second function can be prevented from being erroneously executed.

In each example above, the example in which the substantially center portion of the operation position specifying recess 3a is the through-hole h1 (h2, h3, h4) has been described, but as shown in FIG. 27, for example, the operation position specifying recess 3a may be formed into a shape having a flat surface portion 15 on the inner side of the circumferential portion 5, the flat surface portion 15 being thinner than the circumferential portion 5.

When the inner side portion of the circumferential portion 5 of the operation position specifying recess 3a is made thinnest, it is possible to prevent the display surface 100b of the electronic apparatus 100 from being damaged without hindering detection performance for a contact operation of the operator. Further, the strength of the cover portion 3 can also be improved.

In the electronic apparatus 100 such as a smartphone, a protective film 107 may be attached so as to protect the display surface 100b.

FIG. 27 shows the close state with the protective film 107 being attached to the display surface 100b.

In this case, it is desirable that the thickness of the thinnest portion of the operation position specifying recess 3a or the thickness of the circumferential portion 5 is set to such a thickness that the above-mentioned various contact operations can be performed safely even in a state where the protective film 107 is attached to the surface of the display surface 100b.

It should be noted that the protective film 107 may be the electronic apparatus cover 1 as shown in FIG. 28.

In a case where the protective film 107 functions as the electronic apparatus cover 1, the protective film 107 is the cover portion 3. The electronic apparatus cover 1 does not include the holding portion 2 and the coupling portion 4.

In the examples shown in FIGS. 21A and 21B, the example in which the reference position specifying portions 11, 11, . . . formed of metal or the like come into contact with the display surface 100b has been described, but the reference position specifying portions 11, 11, . . . may be configured to not come into contact with the display surface 100b by being provided inside the base 3b (see FIG. 29). Note that it is necessary to configure the reference position specifying portions 11 so as to be capable of changing a capacitance of the electronic apparatus 100 in the close state.

With this configuration, damage or the like of the display surface 100b due to a contact of the reference position specifying portion 11 can be prevented.

In each example above, the example in which predetermined functions are executed for both the swipe operation (or flick operation) performed from the base 3b toward the center of the operation position specifying recess 3a and the swipe operation (or flick operation) performed from the center of the operation position specifying recess 3a toward the base 3b has been described, but a predetermined function may be executed by receiving only a swipe operation (or flick operation) performed from the center of the operation position specifying recess 3a toward the base 3b.

For example, in a case where the operator performs a contact operation without looking at the electronic apparatus, it is conceivable that the operator unintentionally performs a swipe operation from the base 3b toward the center of the operation position specifying recess 3a while searching for the operation position specifying recess 3a in a blind way.

When the electronic apparatus 100 detects this unintentional operation and executes a predetermined function, this is likely to result in behavior not intended by the operator.

In view of such a case, the application of the electronic apparatus 100 is configured to receive only a swipe operation performed from the center of the operation position specifying recess 3a toward the base 3b, so that the malfunction can be prevented.

In the above description, the example in which the reference position specifying portions 11, 11, . . . in the different arrangement forms may be provided in order to detect to which holding portion 2 of the electronic apparatus covers 1, 1A, 1B the electronic apparatus 100 is held has been described, but different IC (Integrated Circuit) chips may be embedded in the electronic apparatus covers 1, 1A, 1B instead of providing the different arrangement forms of the reference position specifying portions 11.

In such a case, it is desirable that the electronic apparatus 100 is provided with a function capable of reading an IC chip in advance so as to read an IC chip provided to the electronic apparatus cover 1, 1A, 1B in the close state.

Whet the IC chip is read in the close state, the electronic apparatus 100 can grasp which of the electronic apparatus covers 1, 1A, 1B is mounted, and the application corresponding to each of the electronic apparatus covers 1, 1A, 1B can be activated.

With this configuration, the operator can handle the electronic apparatus 100 equally to a dedicated device having a predetermined function by only mounting each of the electronic apparatus covers 1, 1A, 1B to the electronic apparatus 100 and using it in the close state.

Further, when the electronic apparatus covers 1, 1A, 1B include the IC chips, similar products of the electronic apparatus covers 1, 1A, 1B, 1C can be prevented from being offered in markets.

By the way, the electronic apparatus 100 may be held by the holding portion 2 of each of the electronic apparatus covers 1, 1A, 1B, 1C, 1D and operated with help from the texture in a traveling vehicle.

In such a case, it is desirable that the electronic apparatus covers 1, 1A, 1B, 1C, 1D each have a shape maintaining a stable posture of the electronic apparatus 100 in the traveling vehicle.

FIG. 30 shows an example of such electronic apparatus covers 1, 1A, 1B, 1C, 1D.

An electronic apparatus cover 1E shown in FIG. 30 includes a mounting portion 16.

The outer shape of the mounting portion 16 is formed into the same shape as the inner-side shape of a drink holder provided in a vehicle. When the mounting portion 16 is inserted into the drink holder, it is possible to stabilize the posture of the electronic apparatus 100 and improve operability.

The mounting portion 16 may be formed integrally with the holding portion 2 or may be formed separately from the holding portion 2.

In a case where the mounting portion 16 is formed separately from the holding portion 2, it is desirable that the mounting portion 16 is detachable from the holding portion 2.

When the mounting portion 16 is detachable from the holding portion 2, a portable electronic apparatus cover 1 (see FIG. 2) can be attached to the mounting portion 16 for use.

6. CONCLUSION

The electronic apparatus cover 1 (1A, 1B, 1C, 1D, 1E) described above includes the cover portion 3 that covers at least a part of the display surface 100b of the electronic apparatus 100, the display surface 100b including the operation region in at least a part thereof. The cover portion 3 includes the operation position specifying recess 3a for specifying the operation position, and the base 3b is a portion other than the operation position specifying recess 3a. At least a part of the circumferential portion 5 (5A, 5B, 5C) of the operation position specifying recess 3a is the operated portion 6 (6P, 6Q, 6R, 6S), which is thinner than the base 3b and on which a contact operation for causing the electronic apparatus 100 to execute a specific function is performed.

With this configuration, a specific function of the electronic apparatus 100 can be used in a state where the display surface 100b is covered by the cover portion 3, and thus it is possible to improve convenience with respect to the electronic apparatus 100 for the purpose of protection of the electronic apparatus 100 in a state where the electronic apparatus 100 is mounted to the holding portion 2 of the electronic apparatus cover 1.

Further, for example, in a case where the operation position is searched for with help from the texture given to a fingertip, a position to be operated can be easily specified by the operation position specifying recess 3a, and the operator can perform an operation following the intension of the operator without visually recognizing the electronic apparatus 100.

Further, since the thickness of the operated portion 6 is thinner than the thickness of the base 3b, the position of the operated portion 6 for executing a specific function can be easily specified. In particular, when the operated portion 6 is the circumferential portion 5 of the operation position specifying recess 3a, the position of the operated portion 6 can be more easily specified.

Therefore, when executing a specific function, the operator easily grasps the position of the operated portion 6 for executing that specific function. In other words, the operator can perform the operation for executing the function without visually recognizing the electronic apparatus 100.

Furthermore, as described in Patent Literature 1, it is unnecessary to dispose, in the periphery of the display surface 100b, the operation surface for enabling an intended input without looking at the display surface 100b. Thus, the size of the display surface 100b to the electronic apparatus 100 can be enlarged, and the display surface 100b can be enlarged without increasing the electronic apparatus 100 in size.

Therefore, reduction in size of the electronic apparatus cover 1 that protects the electronic apparatus 100 can be achieved.

As described above, the electronic apparatus cover 1 may include the holding portion 2 that holds the electronic apparatus 100, and the coupling portion 4 that couples the holding portion 2 and the cover portion 3 to each other.

With this configuration, the cover portion 3 is connected to the holding portion 2 via the coupling portion 4, which can prevent the cover portion 3 from dropping.

As described above, the coupling portion 4 may be bendable in the electronic apparatus cover 1.

When the coupling portion 4 is bent, it is possible to switch between the close state and the open state. In other words, in a state where the holding portion 2 holds the electronic apparatus 100, it is possible to switch between a state where a specific function can be executed with the cover portion 3 covering the display surface 100b of the electronic apparatus 100 and a state where a specific function cannot be executed with the cover portion 3 not covering the display surface 100b.

With this configuration, it is possible to select whether to use a specific function or not depending on opening/closing of the cover portion 3 with respect to the holding portion 2 and to differently use the two usage modes for the electronic apparatus 100 depending on opening/closing of the cover portion 3 with respect to the holding portion 2.

As described above, the electronic apparatus cover 1 may include the locking portion 9 for maintaining the state where the cover portion 3 covers at least a part of the display surface 100b.

With this configuration, the position of the cover portion 3 is difficult to shift with respect to the display surface 100b including the operation region. Thus, a specific function intended by the operator can be reliably executed when a contact operation is performed on the operated portion 6.

As described above, the operated portion 6 of the electronic apparatus cover 1 may include an inclined surface displaced on the display surface 100b side with increasing distance to the inner side of the operation position specifying recess 3a.

With this configuration, the operation position can be easily specified when the operator performs a contact operation on the inclined surface.

As described above, the operated portion 6 of the electronic apparatus cover 1 may include the first operated portion 6P to be operated for executing the first function and the second operated portion 6Q to be operated for executing the second function.

With this configuration, at least two different functions are executed when contact operations are performed on the respective operated portions 6P, 6Q, and the functionality of the electronic apparatus cover 1 can be improved.

As described above, the second operated portion 6Q of the electronic apparatus cover 1 may be provided at a position at which the first operated portion 6P is rotated by substantially 90° with respect to the center of the operation position specifying recess 3a.

With this configuration, the positions of the first operated portion 6P and the second operated portion 6Q are easily specified on the basis of the texture, and the first function and the second function can be prevented from being mistaken and erroneously executed.

As described above, the inner side portion of the circumferential portion 5 of the operation position specifying recess 3a of the electronic apparatus cover 1 may be a through-hole that allows direct contact with the operation region of the electronic apparatus 100.

With this configuration, the difference in thickness between the outer circumferential edge 5a and the inner circumferential edge 5b of the circumferential portion 5 increases. Thus, the functionality of the electronic apparatus cover 1 can be improved, and reduction in weight of the electronic apparatus cover 1 can be achieved.

Further, as described in the modified examples (particularly in FIG. 27), in the operation position specifying recess 3a of the electronic apparatus cover 1, the inner side portion of the circumferential portion 5 may be provided as a flat surface portion 15 thinner than the circumferential portion 5.

This provides a configuration to inhibit the fingertip or the like from directly touching the display surface 100b when a contact operation is performed on the operated portion 6, and thus the display surface 100b of the electronic apparatus 100 can be prevented from being damaged.

As described in the configuration of the electronic apparatus cover for performing the position correction, at least three reference position specifying portions 11 specified as reference positions with respect to the base 3b may be provided.

In this case, a relative position of the cover portion 3 with respect to the display surface 100b is determined by specifying the reference positions.

When the display surface 100b of the electronic apparatus 100 detects a contact (approximation) of the reference position specifying portions 11, the mounting of the electronic apparatus cover 1 to the electronic apparatus 100 is grasped by software or the like.

Therefore, since the electronic apparatus 100 does not need to include the magnet or the like, reduction in number of components and in cost can be achieved. Additionally, since it is unnecessary to prepare a dedicated electronic apparatus 100 including a magnet in order to support the various electronic apparatus covers 1 described above, general versatility of the electronic apparatus cover 1 can be enhanced.

As described above, it is desirable that the reference position specifying portion 11 of the electronic apparatus cover 1 is formed of a material that changes a capacitance of the display surface 100b.

With this configuration, when a touch panel type liquid crystal is particularly used as the display surface 100b of the electronic apparatus 100, a relative position of the cover portion 3 with respect to the display surface 100b is easily grasped.

Therefore, a corresponding specific function can be more reliably executed according to an operation performed on the operated portion 6 by the operator.

As described using FIGS. 10 and 11, in the circumferential portion 5 of the electronic apparatus cover 1, portions that are on the opposite sides and sandwich the center portion of the operation position specifying recess 3a therebetween may be the operated portions 6.

With this configuration, the operator can differently use a plurality of functions by operations in the same operation direction and differently use a plurality of functions with ease.

Further, the circumferential portion 5 as a whole may be the operated portion 6.

With this configuration, a plurality of functions can be assigned to a single operation position specifying recess 3a, and the operator can execute many functions by finding out the single operation position specifying recess 3a by using only a sense of touch.

Further, since the function can be executed at any position of the circumferential portion 5, usability of the electronic apparatus cover 1 can be improved.

Additionally, a specific function may be executed by a contact operation whose operation direction is an inclination direction of the operated surface 7.

For example, since a specific function is executed by a swipe operation climbing over a slant surface, or the like, the operator can sense a feeling of climbing over the slant surface and thus clearly recognize that the specific function is executed.

Furthermore, a function of switching an image displayed on the display surface 100b depending on the operation direction of the contact operation may be executed as a specific function.

With this configuration, the operation direction of the contact operation in the operation position specifying recess 3a and the direction in which the image is fed can be caused to coincide with each other, and thus an intuitive operation can be performed and the operability can be improved.

It should be noted that the effects described herein are merely examples and are not limited, and other effects may be provided.

7. PRESENT TECHNOLOGY

The present technology can employ the following configurations.

(1) An electronic apparatus cover, including
a cover portion that covers at least a part of a display surface of an electronic apparatus, the display surface including an operation region in at least a part thereof, the cover portion including
an operation position specifying recess for specifying an operation position in the operation region, and
a base being a portion other than the operation position specifying recess,
at least a part of a circumferential portion of the operation position specifying recess being an operated portion, the operated portion being thinner than the base, a contact operation for causing the electronic apparatus to execute a specific function being performed on the operated portion.
(2) The electronic apparatus cover according to (1), further including:
a holding portion that holds the electronic apparatus; and
a coupling portion that couples the holding portion and the cover portion to each other.
(3) The electronic apparatus cover according to (2), in which
the coupling portion is bendable.
(4) The electronic apparatus cover according to (2) or (3), further including
a locking portion for maintaining a state where the cover portion covers the at least a part of the display surface.
(5) The electronic apparatus cover according to any one of (1) to (4), in which
the operated portion includes an inclined surface that is displaced to a display surface side with increasing distance to an inner side of the operation position specifying recess, and
the inclined surface is to be touched and operated as the operated surface.
(6) The electronic apparatus cover according to any one of (1) to (5), in which
the operated portion includes
a first operated portion to be operated for executing a first function, and
a second operated portion to be operated for executing a second function.
(7) The electronic apparatus cover according to (6), in which
the second operated portion is provided at a position at which the first operated portion is rotated by substantially 90° with respect to a center of the operation position specifying recess.
(8) The electronic apparatus cover according to any one of (1) to (7), in which
an inner side portion of the circumferential portion of the operation position specifying recess is a through-hole that allows direct contact with the operation region of the electronic apparatus.
(9) The electronic apparatus cover according to any one of (1) to (8), in which
an inner side portion of the circumferential portion of the operation position specifying recess is provided as a flat surface portion that is thinner than the circumferential portion.
(10) The electronic apparatus cover according to any one of (1) to (9), in which
the base includes at least three reference position specifying portions that are specified as reference positions with respect to the base, and
a relative position of the cover portion to the display surface is determined by specifying the reference positions.
(11) The electronic apparatus cover according to (10), in which
the reference position specifying portion is formed of a material that changes a capacitance of the display surface.
(12) The electronic apparatus cover according to any one of (1) to (11), in which
the operated portions are portions of the circumferential portion that are on opposite sides and sandwich a center portion of the operation position specifying recess therebetween.
(13) The electronic apparatus cover according to any one of (1) to (12), in which
the operated portion is the circumferential portion as a whole.
(14) The electronic apparatus cover according to (5), in which
the specific function is executed by the contact operation whose operation direction is an inclination direction of the operated surface.
(15) The electronic apparatus cover according to any one of (1) to (14), in which a function of switching an image displayed on the display surface depending on an operation direction of the contact operation is executed as the specific function.

REFERENCE SIGNS LIST 1, 1A, 1B, 1C, 1D, 1E electronic apparatus cover
2 holding portion
3 cover portion
3a operation position specifying recess
3b base
4 coupling portion
5, 5A, 5B, 5C circumferential portion
6 operated portion
6P first operated portion
6Q second operated portion
7 operated surface
9 locking portion
11 reference position specifying portion
15 flat surface portion
h1, h2, h3, h4 through-hole
100 electronic apparatus
100b display surface

The invention claimed is:

1. An electronic apparatus cover, comprising
a cover portion that covers at least a part of a display surface of an electronic apparatus, the display surface including an operation region in at least a part thereof, the cover portion including
an operation position specifying recess for specifying an operation position in the operation region, and
a base being a portion other than the operation position specifying recess,
at least a part of a circumferential portion of the operation position specifying recess being an operated portion, the operated portion being thinner than the base, a contact operation for causing the electronic apparatus to execute a specific function being performed on the operated portion.

2. The electronic apparatus cover according to claim 1, further comprising:
a holding portion that holds the electronic apparatus; and
a coupling portion that couples the holding portion and the cover portion to each other.

3. The electronic apparatus cover according to claim 2, wherein
the coupling portion is bendable.

4. The electronic apparatus cover according to claim 2, further comprising
a locking portion for maintaining a state where the cover portion covers the at least a part of the display surface.

5. The electronic apparatus cover according to claim 1, wherein
the operated portion includes an inclined surface that is displaced to a display surface side with increasing distance to an inner side of the operation position specifying recess, and
the inclined surface is to be touched and operated as an operated surface.

6. The electronic apparatus cover according to claim 1, wherein
the operated portion includes
a first operated portion to be operated for executing a first function, and
a second operated portion to be operated for executing a second function.

7. The electronic apparatus cover according to claim 6, wherein
the second operated portion is provided at a position at which the first operated portion is rotated by substantially 90° with respect to a center of the operation position specifying recess.

8. The electronic apparatus cover according to claim 1, wherein
an inner side portion of the circumferential portion of the operation position specifying recess is a through-hole that allows direct contact with the operation region of the electronic apparatus.

9. The electronic apparatus cover according to claim 1, wherein
an inner side portion of the circumferential portion of the operation position specifying recess is provided as a flat surface portion that is thinner than the circumferential portion.

10. The electronic apparatus cover according to claim 1, wherein
the base includes at least three reference position specifying portions that are specified as reference positions with respect to the base, and
a relative position of the cover portion to the display surface is determined by specifying the reference positions.

11. The electronic apparatus cover according to claim 10, wherein
the reference position specifying portion is formed of a material that changes a capacitance of the display surface.

12. The electronic apparatus cover according to claim 1, wherein operated portions are portions of the circumferential portion that are on opposite sides and sandwich a center portion of the operation position specifying recess therebetween.

13. The electronic apparatus cover according to claim 1, wherein
the operated portion is the circumferential portion as a whole.

14. The electronic apparatus cover according to claim 5, wherein
the specific function is executed by the contact operation whose operation direction is an inclination direction of the operated surface.

15. The electronic apparatus cover according to claim 1, wherein
a function of switching an image displayed on the display surface depending on an operation direction of the contact operation is executed as the specific function.

* * * * *